United States Patent
Mangell

(10) Patent No.: US 7,316,934 B2
(45) Date of Patent: Jan. 8, 2008

(54) PERSONALIZED HARDWARE

(75) Inventor: Efraim Mangell, Jerusalem (IL)

(73) Assignee: Zavitan Semiconductors, Inc., Jerusalem (IL)

( * ) Notice: Subject to any disclaimer, the term of this patent is extended or adjusted under 35 U.S.C. 154(b) by 594 days.

(21) Appl. No.: 10/181,518

(22) PCT Filed: Dec. 18, 2000

(86) PCT No.: PCT/GB00/04869

§ 371 (c)(1),
(2), (4) Date: Dec. 16, 2002

(87) PCT Pub. No.: WO01/54194

PCT Pub. Date: Jul. 26, 2001

(65) Prior Publication Data

US 2003/0144760 A1  Jul. 31, 2003

(30) Foreign Application Priority Data

| Jan. 20, 2000 | (US) | ................................ 60/177,087 |
| Mar. 16, 2000 | (US) | ................................ 60/189,756 |
| Mar. 22, 2000 | (US) | ................................ 60/191,208 |
| Oct. 2, 2000 | (US) | ................................ 60/237,458 |

(51) Int. Cl.
H01L 21/00 (2006.01)

(52) U.S. Cl. ........... 438/7; 257/E21.581; 257/E21.582; 438/16

(58) Field of Classification Search ............... 438/5, 438/6, 7, 16, 14; 257/E21.582, E21.581, 257/E21.585; 359/2, 293
See application file for complete search history.

(56) References Cited

U.S. PATENT DOCUMENTS

| 4,198,696 A | 4/1980 | Bertin et al. ................. 365/175 |
| 4,409,686 A * | 10/1983 | Ports et al. .................. 382/144 |
| 4,510,673 A | 4/1985 | Shils et al. .................... 29/547 |

(Continued)

FOREIGN PATENT DOCUMENTS

DE  198 29 674  1/2000

(Continued)

OTHER PUBLICATIONS

IBM Tech. Discl. Bull. vol. 39, No. 1, pp. 287-290(Jan. 1, 1996).*

(Continued)

*Primary Examiner*—Caridad Everhart
(74) *Attorney, Agent, or Firm*—Hoffman, Wasson and Gitler

(57) ABSTRACT

A system for personalizing one or more electrical circuits having plurality of layers with electrical characteristics. The layers being produced by an electrical characteristic determination process (ECDP). The system for personalizing includes a wafer stage for receiving a wafer in order to produce a plurality of electrical circuits. The system is configured to apply a personalization process during production of the layers. The personalization process includes using a first ECDP in the layer to produce identical electrical characteristics on the wafer in each of the plurality of electrical circuits, and using a second ECDP in the layer to modify one or more electrical characteristics in selected electrical circuits so as to incorporate in the selected circuits an individualized digital number, giving rise to the desired personalizing of one or more of the specified electrical circuits. Related apparatus and methods are also provided.

30 Claims, 17 Drawing Sheets

U.S. PATENT DOCUMENTS

| | | | | |
|---|---|---|---|---|
| 4,720,470 | A | | 1/1988 | Johnson ..................... 438/14 |
| 4,766,516 | A | * | 8/1988 | Ozdemir et al. ............ 361/820 |
| 4,875,971 | A | | 10/1989 | Orbach et al. .............. 156/644 |
| 4,916,809 | A | | 4/1990 | Boudou et al. ............... 29/852 |
| 4,931,671 | A | | 6/1990 | Agrawal ..................... 307/465 |
| 4,937,475 | A | | 6/1990 | Rhodes et al. ............. 307/465 |
| 5,008,830 | A | * | 4/1991 | Moriizumi et al. ........... 716/21 |
| 5,093,550 | A | | 3/1992 | Gerber et al. .......... 219/121.69 |
| 5,109,149 | A | | 4/1992 | Leung .................. 219/121.69 |
| 5,111,273 | A | | 5/1992 | Orbach et al. ................ 357/51 |
| 5,208,178 | A | * | 5/1993 | Usami ........................... 438/6 |
| 5,242,850 | A | | 9/1993 | Tasaka ....................... 438/637 |
| 5,294,812 | A | | 3/1994 | Hashimoto et al. .......... 257/65 |
| 5,302,491 | A | * | 4/1994 | Akylas et al. .............. 430/311 |
| 5,350,715 | A | | 9/1994 | Lee ............................. 438/14 |
| 5,378,581 | A | | 1/1995 | Vernon ...................... 430/313 |
| 5,410,124 | A | | 4/1995 | Jackson ................. 219/121.68 |
| 5,481,102 | A | | 1/1996 | Hazerigg, Jr. ............... 235/487 |
| 5,533,123 | A | * | 7/1996 | Force et al. ................ 713/189 |
| 5,545,904 | A | | 8/1996 | Orbach ........................... 27/2 |
| 5,607,801 | A | | 3/1997 | Nozue ........................ 430/22 |
| 5,619,062 | A | | 4/1997 | Janai et al. ................. 257/529 |
| 5,671,435 | A | | 9/1997 | Alpert ........................ 395/800 |
| 5,672,994 | A | | 9/1997 | Au et al. .................... 327/525 |
| 5,679,967 | A | | 10/1997 | Janai et al. ................. 257/209 |
| 5,721,150 | A | | 2/1998 | Pasch ......................... 438/512 |
| 5,727,231 | A | | 3/1998 | Bartley et al. ............. 395/858 |
| 5,732,207 | A | | 3/1998 | Allen et al. ........... 395/182.93 |
| 5,733,711 | A | | 3/1998 | Juengling ................... 430/312 |
| 5,774,544 | A | | 6/1998 | Lee et al. ....................... 380/4 |
| 5,794,066 | A | | 8/1998 | Dreyer et al. .......... 395/800.32 |
| 5,799,080 | A | | 8/1998 | Padmanabhan et al. ........ 380/4 |
| 5,808,268 | A | | 9/1998 | Balz et al. ............... 219/121.8 |
| 5,881,038 | A | * | 3/1999 | Oshima et al. .......... 369/47.12 |
| 5,903,490 | A | | 5/1999 | Rotem et al. ................. 365/63 |
| 5,937,270 | A | | 8/1999 | Canella ....................... 438/14 |
| 5,994,030 | A | | 11/1999 | Sugihara et al. ............ 430/296 |
| 6,002,773 | A | * | 12/1999 | Javidi .......................... 380/54 |
| 6,018,686 | A | | 1/2000 | Orso et al. ............. 364/468.28 |
| 6,063,685 | A | | 5/2000 | Steffan et al. ......... 219/121.69 |
| 6,065,113 | A | | 5/2000 | Shiell et al. ........... 395/800.38 |
| 6,197,456 | B1 | * | 3/2001 | Aleshin et al. ................. 430/5 |
| 6,228,564 | B1 | * | 5/2001 | Huggins ..................... 430/328 |
| 6,242,767 | B1 | * | 6/2001 | How et al. .................. 257/202 |
| 6,476,493 | B2 | | 11/2002 | Or-bach et al. ............. 257/758 |
| 6,613,611 | B1 | * | 9/2003 | How et al. .................. 438/130 |
| 6,813,058 | B1 | | 11/2004 | Sandstrom .................. 359/290 |
| 2005/0047543 | A1 | * | 3/2005 | Sandstrom .................... 378/34 |

FOREIGN PATENT DOCUMENTS

| | | |
|---|---|---|
| EP | 484 128 | 5/1992 |
| JP | 1-293616 | 11/1989 |

OTHER PUBLICATIONS

"Laser personalized bipolar PLA", IBM Technical Disclosure Bulletin, Nov. 1978.

"Read only memory fabrication by laser formed connections", IBM Technical Disclosure Bulletin, Jan. 1973.

"Sub-micron array personalization using radiation effect", IBM Technical Disclosure Bulletin, Mar. 1985.

S.M. Balyeu, et al., "Laser personalization tool", IBM Technical Disclosure Bulletin, vol. 22, No. 3, Aug. 1979.

S.M. Balyeu, et al., "Laser personalization control system", IBM Technical Disclosure Bulletin, vol. 22, No. 3, Aug. 1979.

R. Cullet, et al., "Programmable read-only memory programmed by laser means", IBM Technical Disclosure Bulletin, vol. 24, No. 7A, Dec. 1981.

L. Dwyer, et al., "Lithographic chip identification: meeting the failure analysis challenge", SPIE vol. 1673, Integrated Circuit Metrology, Inspection, and Process Control, VI (1992).

"Data protection on magnetic media via an encrypting controller", IBM Technical Disclosure Bulletin, Aug. 1987.

D.L. Bergeron, et al., "Programmable chip identification technique", IBM Technical Disclosure Bulletin, vol. 24, No. 7A, Dec. 1981.

Henry Dreifus, et al., "Smart Cards", Chapter Four, John Wiley & Sons, 1998.

T. Yoshida, et al., "Development of A one-chip microcomputer for IC cards", OKI Technical Review 129, vol. 54, Jan. 1988.

H. Nakamura, et al., "A microprocessor with 2Kbytes EEPROM for data security applications", 1987 IEEE International solid-state circuit conference.

R. Defrancesco, et al., "Intelligent non-volatile memory for smart cards", IEEE Trans. On Consumer Electronics, vol. CE-32, No. 3, Aug. 1986.

Rex A. Lee, et al., "High density interconnects for rapid prototyping of electronic systems", 1993 IEEE/CHMT Int'l Electronics Manufacturing Technology Symposium.

"Electronics Manufacturing for the year 2000", 1993 IEEE/CHMT Int'l Electronics Manufacturing Technology Symposium.

Rex Lee, et al., "Rapid prototyping using laser created interconnects", 1994 IEEE/CPMT Int'l Electronics Manufacturing Technology Symposium.

Oliver Kommerling, et al., "Design principles for tamper-resistant smartcard processor", USENIX Workshop on Smartcard Technology, May 10-11, 1999.

Lee, R.A., et al., "Laser created high density interconnects for quick prototyping of electronic circuits", IEEE 1994 44th Electronic components and technology conference, p. 270-2, (an abstract).

Allen D.L. et al., "Design aids and test results for laser-programmable logic arrays", 1990 IEEE Int'l Conf. On Computer Design, p. 386-90, (an abstract).

Peterson, M., "Secure single chip microcomputer manufacture", Smart Card 2000 Conference, Netherlands, 1991, p. 29-37, (an abstract).

* cited by examiner

PERSONALIZED HARDWARE

FIELD OF THE INVENTION

The present invention relates to design and manufacture of integrated circuits (ICs) and, more specifically, to apparatus and methods for personalizing ICs.

BACKGROUND OF THE INVENTION

In the semiconductor industry, there is a need to enable differentiation between single chips for purposes, for example, of: manufacturing control; tracking of the chips' history; and identification and serial numbers in various applications.

The semiconductor manufacturing processes for mass production in general is based upon methods for making a large number of "many-of-the-same" chips, and therefore, to differentiate between chips effectively and efficiently without compromising the manufacturing throughput capacity, cost and quality is a major challenge.

Depending on the purpose for the differentiation and on the abilities of the available technology, various solutions have been presented in the prior art.

For manufacturing control and chip history tracking, visual identification solutions have been proposed. Examples include the following:

U.S. Pat. No. 6,063,685 to Steffan et al., which describes a method for visual identification by inscribing characters on a chip with laser direct write;

U.S. Pat. No. 4,510,673 to Shils et al., which describes visible human and machine-readable laser scribed identification; and U.S. Pat. No. 5,350,715 to Lee, which describes a visual dot matrix for chip-on-wafer location data.

Software solutions of various kinds have been proposed to implement ID or serial numbers in microprocessors and other chips. These may comprise numbers being programmed and stored in non-volatile memories (NVM) of various types and used by the processor through memory reads, typically via a bus.

U.S. Pat. No. 6,018,686 to Orso et al. describes an IC with manufacturing information stored in non-volatile memory.

U.S. Pat. No. 5,732,207 to Allen et al. describes a microprocessor with on-chip EPROM holding manufacturing and configuration information.

U.S. Pat. No. 5,774,544 to Lee et al. describes an apparatus and method for encrypted serial numbers for a CPU die stored in a non-volatile RAM die, both within a single package.

U.S. Pat. No. 5,790,663 to Lee et al. describes a software apparatus and method for access to an encrypted serial number.

U.S. Pat. No. 5,794,066 to Dreyer et al. describes an apparatus and method for identifying microprocessor data of origin, type, stepping, and other parameters, stored in constant ROM or regular registers Various hardware solutions including fuses or anti-fuses have been proposed. Some of them are programmed with high voltage or current, and some are programmed with external means, like laser cutting or welding. The following are examples of the prior art:

U.S. Pat. No. 5,672,994 to Au et al., the disclosure of which is hereby incorporated herein by reference, describes an improved antifuse MOSFET;

U.S. Pat. No. 4,916,809 to Boudou et al. describes a method for programmable laser welding anti-fuses;

U.S. Pat. No. 4,937,475 to Rhodes et al. describes a programmable circuit where conductor links are broken or connected by laser; and U.S. Pat. No. 6,065,113 to Shiell et al. describes a method including an identifier in a microprocessor implemented by means of an OTP register including laser breakable fuses, fuses or anti-fuses programmed by current, or an identifier stored in an EPROM or written by e-beam in an all e-beam lithography process.

In some cases, it is known in the art to combine optical parallel lithography with e-beam lithography. Examples of the prior art include:

U.S. Pat. No. 5,994,030 to Sugihara et al., which describes a lithographic system combining optical lithography with e-beam exposure for improved resolution and throughput;

Japan Public-disclosure No. 4-155812, assigned to Hitachi, which describes a method for combining optical lithography with e-beam through a phase-shift mask; and Japan Public-disclosure No. 1-293616, assigned to NEC, which describes a method for manufacture of IC's using a common optical light exposure and then an e-beam for writing patterns specific to each IC.

The following patents and publications are examples of other prior art:

U.S. Pat. Nos. 5,357,077; 5,350,715; 4,510,673; 5,109,149; 5,937,270; 5,808,268; 481,102; 5,721,150; 5,727,231; 5,903,490; 5,903,490; 5,679,967; 5,619,062; 5,545,904; 5,111,273; 4,937,475; 4,931,671; 4,875,971; 5,607,801; 4,720,470; 4,720,470; 5,093,550; 5,410,124; and 5,733,711

Examples of other prior art are also found in the following publications:

1987 Japanese patent JP62194565A2 to Isao et al. for a microprocessor with an EPROM for writing security information in it.

IBM Technical Disclosure Bulletin (TDB) article from August 1987, pp. 1284-1285, which describes a security system for protection of data contained on a disk.

January 1988 article from Oki Technical Review 129 by Yoshida and Tanakawa on a one-chip microcomputer for IC cards with a secure EEPROM area.

The disclosures of the following U.S. provisional patent applications, describing aspects of the present invention and having identical inventorship with the present invention, are hereby incorporated herein by reference:

U.S. patent application Ser. No. 60/177,087, filed Jan. 20, 2000;

U.S. patent application Ser. No. 60/189,756, filed Mar. 16, 2000; and

U.S. patent application Ser. No. 60/191,208, filed Mar. 22, 2000.

The disclosures of all references mentioned above and throughout the present specification are hereby incorporated herein by reference.

SUMMARY OF THE INVENTION

In several ways, the prior art solutions as described above have significant drawbacks.

In systems where electrical functionality is required, for example, in which the readout of the different identification details from the chip or their content is influencing the results of some algorithms, visual identification solutions are not appropriate.

The EPROM, EEPROM, FLASH and other similar NVM solutions all require costly extra processing, for on-chip high voltage circuitry, tunnel oxide, floating poly gate, etc., typically adding up to 4 or 5 additional mask layers. Also, the NVM requires extensive extra silicon area.

The software solutions can be attacked by non-intrusive and non-destructive means to read out or reprogram the contents. And additionally, the NVM is difficult to integrate with pure logic processes, for performance and quality reasons, and therefore tends to hold back the process technology by one or two generations. NVRAM requires additional continuous power supply, batteries or the like.

Some of the fuses or anti-fuses are programmed with high voltage or current, and some are programmed with external means, like laser cutting or welding. The high voltage circuitry, special layers, on-chip charge pumps and/or extra pads, again, call for special design, additional processing steps and quality problems related to the fusing, leakage currents and passivation window openings. Reliability problems frequently arise, related to electro migration and reconnection of broken fuses over time. Similarly, where laser cutting or welding is implemented, there are frequent quality problems, and often special layout and/or window openings are required. Some solutions suffer from inconsistent results due to variations in the dielectric layers around and on top of the fuses or anti-fuses.

In the cases of laser cutting or welding, also, a visual path is required for the laser beam. Fuses, in general, are easily visually inspected, and as such, can be attacked, that is, investigated and reverse-engineered, by non-intrusive and non-destructive means.

In both the NVM and fuses/anti-fuses solutions, the freedom in design and implementation is limited both by design, by process and by silicon area constraints.

Therefore, implementing, for example, chip specific true secure hardware of any appropriate size in any of the above mentioned techniques has been impossible or most difficult.

In a preferred embodiment, the present invention seeks to provide an apparatus and method to implement these features in a highly flexible, secure, cheap, reliable and manufacturable manner, reducing the above-mentioned problems of the prior art.

In a preferred embodiment of the present invention, defining chip specific electrical circuits serving as a digital number (which may be used, for example, for serial and ID numbers, keys) while maintaining high manufacturing throughput, low cost, flexibility, security and quality is achieved by combining optical parallel lithography with another specific lithography technique on photoresist.

Some methods described in the prior art combine optical lithography with e-beam lithography. These patents seek to cope with the throughput constraints posed by using e-beam lithography, as perceived in applications requiring the direct write of high-resolution on-chip devices, by combining optical parallel lithography with e-beam direct write. However, it will be appreciated by persons skilled in the art that a method which is capable of achieving further improved throughput would be highly desired in some applications. The present invention seeks to provide, in a preferred embodiment comprising an improved combination of optical parallel lithography with another type of lithography such as e-beam lithography or laser direct write lithography, further improved throughput and processing advantages as well as improved security. Any of the various processes for determining electrical characteristics of a layer of an electrical circuit (such as, for example, optical parallel lithography, or any other type of lithography as discussed above) is also termed herein an electrical characteristic determination process (ECDP).

In the context of the invention, the term PSH link should be construed as a geometric element of any shape, preferably at a pre-defined location, either exposed or not in a lithography exposure to a photo resist, the resulting image then being transferred to a physical layer through subsequent processing.

The present invention provides apparatus and methods to implement personalized secure hardware (PSH) for individualized personalization of chips during their mass production manufacture, typically but not necessarily in the lithography process. Integrating of the PSH is accomplished by exposing in the photoresist any desired number of links (hereinafter referred to as PSH links), which may comprise, for example, polygons. The PSH links being typically arranged into individualized combinations in accordance with a personalization algorithm. Preferably although not necessarily, the individualized combinations are unique for each chip.

The PSH links are formed in one or more layers built on the semiconductor wafer after being defined in a lithography process using a photo-resist.

In accordance with a first aspect of the invention, the PSH links (formed as described above) outline a digital number that is utilized by an application, for example a private or public key serving for identification, authentication, encryption or decryption purposes.

For convenience of explanation only, the present description often refers to digital key. Those versed in the art will readily appreciate that the invention is likewise applicable to any digital number serving as part of or input to an application.

Accordingly, by this aspect of the invention there is provided a method for personalizing an electrical circuit having at least one layer having electrical characteristics, the layer being produced by an electrical characteristic determination process (ECDP), the method for personalizing comprising:

providing a wafer for producing a plurality of electrical circuits each having at least one layer; and during production of the at least one layer:

using a first ECDP in the layer to produce identical electrical characteristics on the wafer in each of the plurality of electrical circuits; and using a second ECDP in the layer to modify at least one electrical characteristic of at least one of the plurality of electrical circuits so as to incorporate therein an individualized digital number, thereby personalizing the at least one of the plurality of electrical circuits.

There is further provided a system for personalizing an electrical circuit having at least one layer having electrical characteristics, the layer being produced by an electrical characteristic determination process (ECDP), the system for personalizing comprising:

A wafer stage for receiving a wafer for producing a plurality of electrical circuits each having at least one layer, wherein the system is further configured to apply a personalization process during production of the at least one layer, the personalization process including:

using a first ECDP in the layer to produce identical electrical characteristics on the wafer in each of the plurality of electrical circuits; and using a second ECDP in the layer to modify at least one electrical characteristic of at least one of the plurality of electrical circuits so as to incorporate therein an individualized digital number, thereby personalizing the at least one of the plurality of electrical circuits.

The invention further provides for: In a method for producing a multiplicity of multi-layer electronic circuits, each electronic circuit comprising a surface layer and at least one sub-surface layer, the surface layer and the at least one sub-surface layer each having at least one electrical characteristic influencing operation of the electronic circuit, an improvement comprising:

selecting one multi-layer electronic circuit;

altering at least one electrical characteristic of at least one sub-surface layer of the one electronic circuit, the altering comprising altering the at least one electrical characteristic so as to incorporate therein an individualized digital number, to be different from a corresponding digital number of at least one other multi-layer electronic circuit produced by the method; and producing a surface layer of the one electronic circuit, wherein the altering occurs before the producing.

The invention further provides for a system of the kind specified.

The invention further provides for: In a method for producing a layer in an electronic circuit, an improvement comprising:

providing a wafer comprising a plurality of chips and coated with a photoresist; and performing the following steps in order:

1. performing parallel photolithography to produce an identical image of an electrical circuit on each of the plurality of chips;
2. selecting one of the plurality of chips; and
3. modifying the image on the one selected chip so as to incorporate therein an individualized digital number.

The invention further provides for a system of the kind specified.

In accordance with another aspect of the invention exposing of the PSH links is accomplished by using a PSH photo-mask. By a preferred embodiment of this aspect of the invention, said photo-mask is used (within the same scanner system) in addition to a parallel lithographic stepping exposure utilizing a general photo-mask that is common for all the chips. Such a PSH photo-mask is dedicated to expose into the photo-resist an individualized pattern achieving a similar result to that achieved by direct write but in a different manner, in this case by masking the full optical light beam and allowing only a spot beam to pass through and bring a spot of appropriate shape and dimensions to the photoresist surface, as further described below. In accordance with another preferred embodiment of this aspect of the invention, the PSH photomask is combined with the general photomask such that, outside the normal exposure field, there is a shape or a plurality of shapes to allow for the spot beam exposure in a second double-exposure. The reticle (mask) is off-set to direct the beam through this shape instead of the general field, while letting through only the spot beam. This method obviates the necessity of exchanging reticles, and thus improves production throughput.

As will be clear to a man of the art, the additional PSH photo-mask may be applied for one or more layers either before or after the general parallel lithographic stepping exposure. In this case, the links will be selectively exposed according to the individualized pattern required for personalization of the specific chip. In accordance with this aspect the PSH links outline any desired electrical functionality. Thus, for example, in accordance with one preferred embodiment of this aspect the specified PSH links outline a digital key that is utilized by an application. In accordance with another preferred embodiment of this aspect, the specified PSH links outline any digital function or an analog circuitry designated for a specific electrical performance.

Accordingly, by this aspect of the invention there is provided a method for personalizing an electrical circuit having at least one layer having electrical characteristics, the layer being produced by an electrical characteristic determination process (ECDP), the method for personalizing comprising:

providing a wafer for producing a plurality of electrical circuits each having at least one layer; and during production of the at least one layer:

using a first ECDP in the layer to produce identical electrical characteristics on the wafer in each of the plurality of electrical circuits; and using a second ECDP in the layer to modify at least one electrical characteristic of at least one of the plurality of electrical circuits, the modification of at least one electrical characteristic of at least one of the plurality of electrical circuits comprising modifying by exposure through at least one Personalized Secure Hardware (PSH) photo mask, thereby personalizing the at least one of the plurality of electrical circuits.

The invention further provides a system of the kind specified. The invention further provides for: In a method for producing a multiplicity of multi-layer electronic circuits, each electronic circuit comprising a surface layer and at least one sub-surface layer, the surface layer and the at least one sub-surface layer each having at least one electrical characteristic influencing operation of the electronic circuit, an improvement comprising:

selecting one multi-layer electronic circuit;

altering at least one electrical characteristic of at least one sub-surface layer of the one electronic circuit, the altering comprising altering by exposing at least a portion of the one sub-surface layer through at least one Personalized Secure Hardware (PSH) photo mask thereby altering the at least one electrical characteristic to be different from a corresponding electrical characteristic of at least one other multi-layer electronic circuit produced by the method; and producing a surface layer of the one electronic circuit, wherein the altering occurs before the producing.

The invention further provides for a system of the kind specified.

The invention further provides for: In a method for producing a layer in an electronic circuit, an improvement comprising:

providing a wafer comprising a plurality of chips and coated with a photoresist; and performing the following steps in order:

1. performing parallel photolithography to produce an identical image of an electrical circuit on each of the plurality of chips;
2. selecting one of the plurality of chips; and
3. modifying the image on the one selected chip; the modifying comprising modifying by exposure through at least one photo mask. The invention further provides for a system of the kind specified.

The PSH technique is suitable, in a preferred embodiment of the present invention, for making individualized chips in mass-production with high throughput. Since the basic circuit design of the IC preferably does not vary from chip to chip, the majority of the chip details are preferably fabricated by parallel optical lithography using conventional manufacturing steps having high throughput, and, therefore, this portion of the process is identical for all the chips. Preferably, only a relatively small portion of the details on the chip is varied when forming the PSH links for chip personalization. Such additional forming of the PSH links therefore preferably does not decrease the throughput significantly. Taking into account the fact that the personalization technique in accordance with the invention requires that preferably only a small portion of the details varies from one chip to another, it has been found in accordance with a third aspect of the invention that a strobe on-the-fly technique can be used to facilitate mass production whilst substantially not deteriorating the manufacturing capacity.

Thus, the invention provides for a method for personalizing an electrical circuit having at least one layer having electrical characteristics, the layer being produced by an electrical characteristic determination process (ECDP), the method for personalizing comprising:

providing a wafer for producing a plurality of electrical circuits each having at least one layer; and during production of the at least one layer:

using a first ECDP in the layer to produce identical electrical characteristics on the wafer in each of the plurality of electrical circuits; and using a second ECDP in the layer to modify at least one electrical characteristic of at least one of the plurality of electrical circuits, the second ECDP comprises direct writing; and wherein said direct writing includes scanning the wafer in either one of X and Y directions and applying during said scanning strobe on-the-fly so as to accomplish said modification, thereby personalizing the at least one of the plurality of electrical circuits.

Alternatively, it is appreciated that a similar method in which a PSH mask is employed instead of direct writing may be used.

The invention further provides for a system of the kind specified. The invention further provides for: In a method for producing a multiplicity of multi-layer electronic circuits, each electronic circuit comprising a surface layer and at least one sub-surface layer, the surface layer and the at least one sub-surface layer each having at least one electrical characteristic influencing operation of the electronic circuit, an improvement comprising:

selecting one multi-layer electronic circuit;

altering at least one electrical characteristic of at least one sub-surface layer of the one electronic circuit, the altering comprises direct writing; and wherein said direct writing includes scanning the layer in either one of X and Y directions and applying during said scanning strobe on-the-fly so as to accomplish said altering, and producing a surface layer of the one electronic circuit, wherein the altering occurs before the producing.

The invention further provides for a system of the kind specified.

The invention further provides for: In a method for producing a layer in an electronic circuit, an improvement comprising:

providing a wafer comprising a plurality of chips and coated with a photoresist; and performing the following steps in order:
1. performing parallel photolithography to produce an identical image of an electrical circuit on each of the plurality of chips;
2. selecting one of the plurality of chips; and
3. modifying the image on the one selected chip; the modifying comprises direct writing; and wherein said direct writing includes scanning the wafer in either one of X and Y directions and applying during said scanning strobe on-the-fly so as to accomplish said modification.

The invention further provides for a system of the kind specified.

The invention further provides for an electrical circuit produced by any of the above referred to methods.

There follows now a brief description of various preferred embodiments, which are applicable to each one of the specified distinct aspects of the invention.

Thus, according to a preferred embodiment of the invention, forming of the PSH links is accomplished by using a direct write beam, such as laser, e-beam, X-ray or other beam source during manufacturing process. During a conventional lithography process after photo-resist is deposited, there are several possible manners in which additional step(s) of forming the PSH links can be applied:

More specifically:

A. The direct write beam is applied to the photoresist (PR) of one or more layers in the locations corresponding to pre-defined PSH links but before the step of applying general exposure of the photo-resist to radiation through a general photo-mask.

B. The direct write beam is applied to the PR of one or more layers when the direct write station is mounted in the lithography stepper concurrently with the general stepping radiation exposure.

C. The direct write beam is applied to the PR of one or more layers after the general stepping radiation exposing, but before the PR development step.

D. The direct write beam is applied to the PR of one or more layers after the development step for the general exposure, but before the etching/implant/diffusion step, for example, in a standalone laser, e-beam or other radiation source station.

When using a positive photo-resist, the link locations exposed to radiation will in the following steps be etched, implanted, diffused, etc., whereas the non-exposed link locations will remain unchanged. A negative photo-resist is also applicable, *mutatis mutandis*. Those skilled in the art will appreciate the effects of, for example, reversing a positive PR to negative by over-exposure, and so forth.

Those having skill in the art will appreciate that by using the PSH technique, practically any layer defined by lithography (with a photoresist), or combination of layers, can be personalized, such as metal- and poly- layers, contacts, vias, implants, active/passive regions, etc. The PSH technique may be customized for many different types of integrated circuits.

According to a preferred embodiment of the present invention the key to be incorporated into a specific chip by utilizing the PSH technique may be calculated with an algorithm utilizing one or more specific manufacturing parameters, such as lot number, wafer number and die x-y coordinates (seed) that individually defines each chip. Algorithms may vary for different chip layers to enhance security.

In accordance with another preferred embodiment, an algorithm that is based on random number seed generation is used as giving rise to individualized (and probably unique) key, which would then be retained for use as will be described in greater detail below. This random number can, for example, be generated by the computer controller of the PSH station.

By a preferred embodiment, algorithms may vary for different layers to enhance security.

By one preferred embodiment, the personalization algorithm(s) is provided by the Customer and kept secret to the wafer fabricator (fab), or in accordance with another preferred embodiment, the fab itself can define the algorithms. Preferably, although not necessarily, the personalization algorithms are kept in a secure encrypted format in the PSH station controller.

Those versed in the art will readily appreciate that the invention is bound neither by the specified personalization algorithms nor by the manner in which the algorithm(s) are provided or stored.

In certain preferred embodiments, the key is incorporated in the IC but is, however, not accessible in an explicit form; this is normally done for security purposes. Thus, for example, if the key value that is incorporated in the chip is X any attempt to access and externally read the key is prevented by design. Thus, an attempt to externally read the key value would give rise to, say $2^X$ instead of X.

In general, any appropriate semiconductor device (chip), block, electric circuit, memory or logic units, can be personalized by using the PSH technology. The PSH links may be implemented in one or more layers and in one preferred embodiment covered for example by subsequent dielectrics and/or metal layers, thus rendering the links hidden and preferably preventing non-intrusive visual (optical) inspection as well as non-destructive micro probing and more sophisticated analysis in Scanning Electron Microscope (SEM) and Focused Ion Beam (FIB), e-beam, voltage contrast analysis and so like. Utilizing planarization technology, such as chemical mechanical polishing (CMP), may further complicate reverse-engineering analysis.

It is appreciated that, in the various aspects of the invention as described above, the electrical or electronic circuit may preferably implement at least one of the following: a redundancy design; a debug design; and a chip design.

BRIEF DESCRIPTION OF THE DRAWINGS

For a better understanding, the invention will now be described, by way of example only, with reference to the accompanying drawings, in which.

DETAILED DESCRIPTION OF THE INVENTION

In accordance with the prior art, the conventional sequence of the parallel lithography process is modified by providing additional steps in the lithography process. In accordance with the prior art, incorporation of individualized electrical circuitry in the integrated circuits during their manufacturing can be accomplished by a direct write beam during the lithography process. There are various sequences in which an additional step of applying the direct write beam to a layer covered with a photo-resist may be carried out.

Figure 1A:
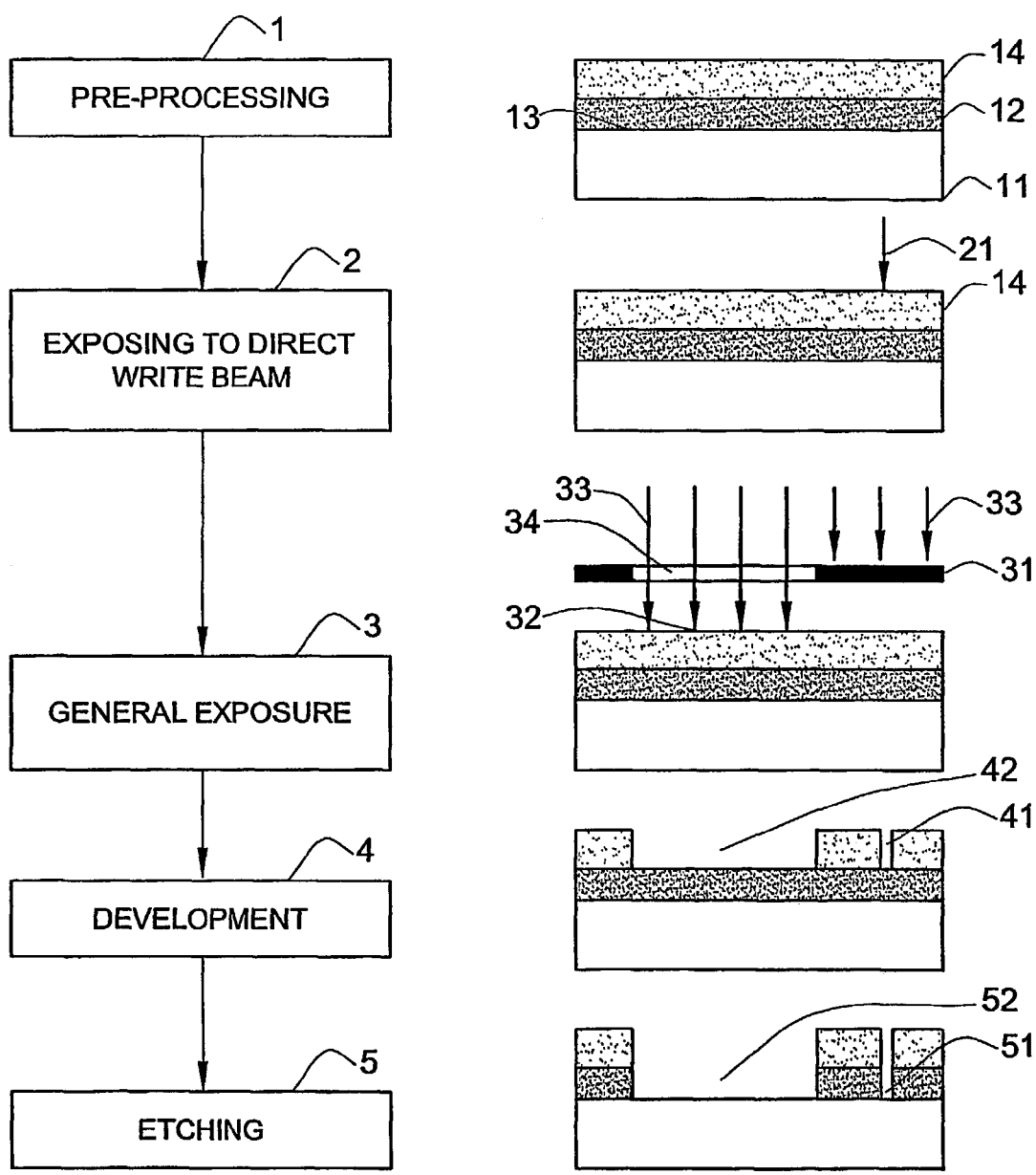
FIG. 1a, 1b and 1d are simplified flowcharts of various preferred sequences of the manufacturing process steps including a direct write step.
Figure 1B:
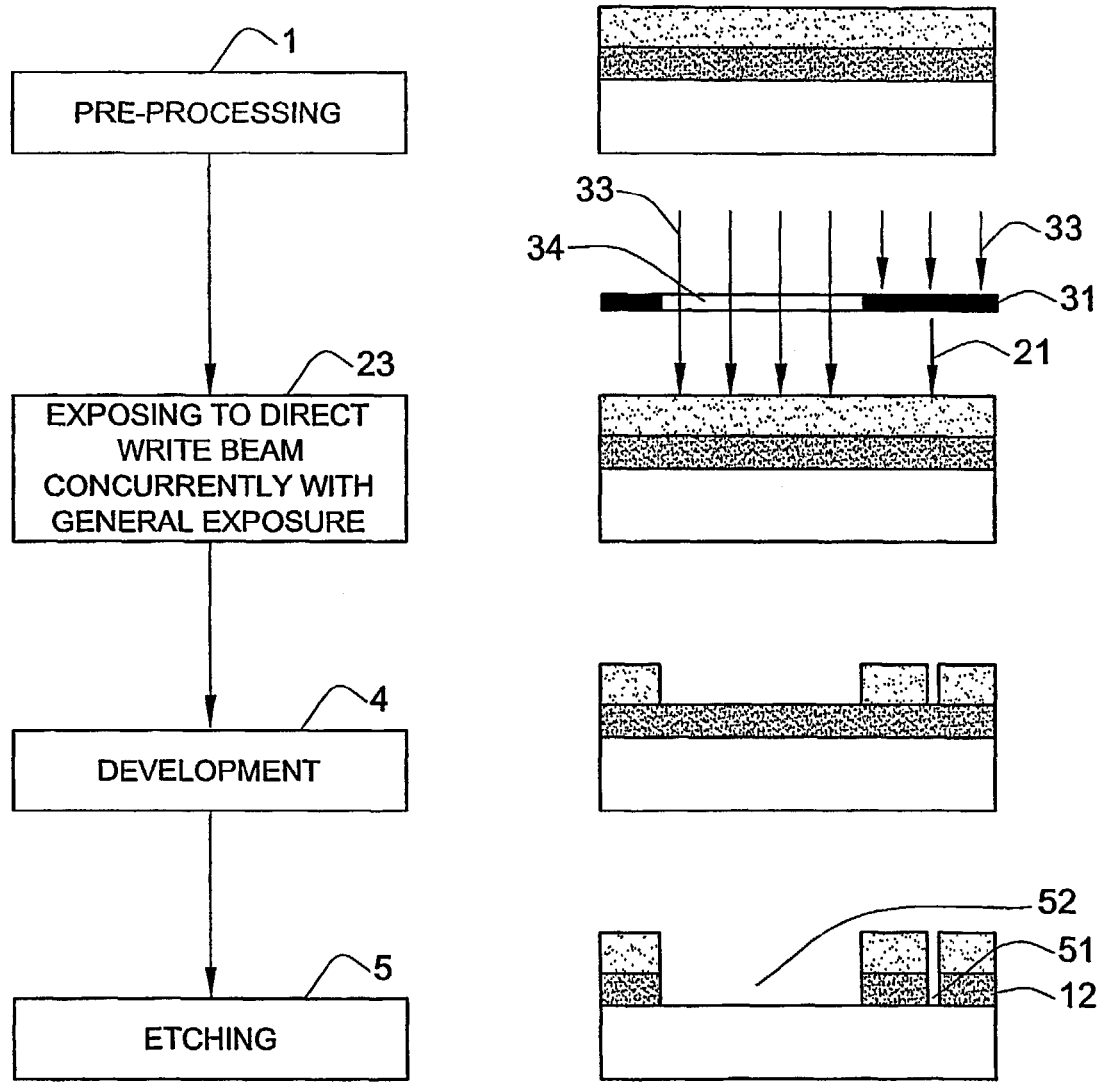
Figure 1C:
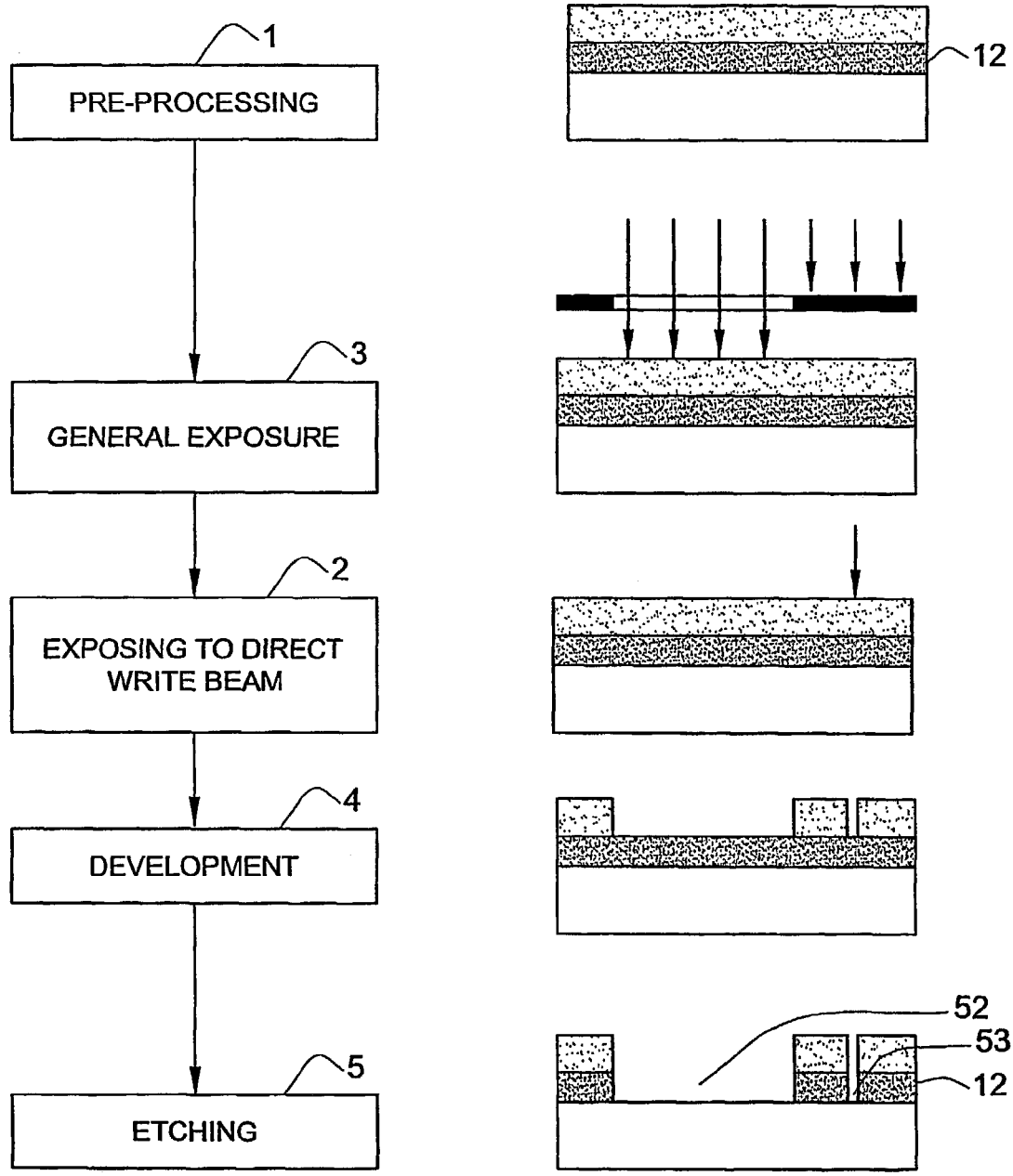
FIG. 1c is a simplified flowchart of a preferred sequence of the manufacturing process steps including a direct write step in accordance with the prior art.
Figure 1D:
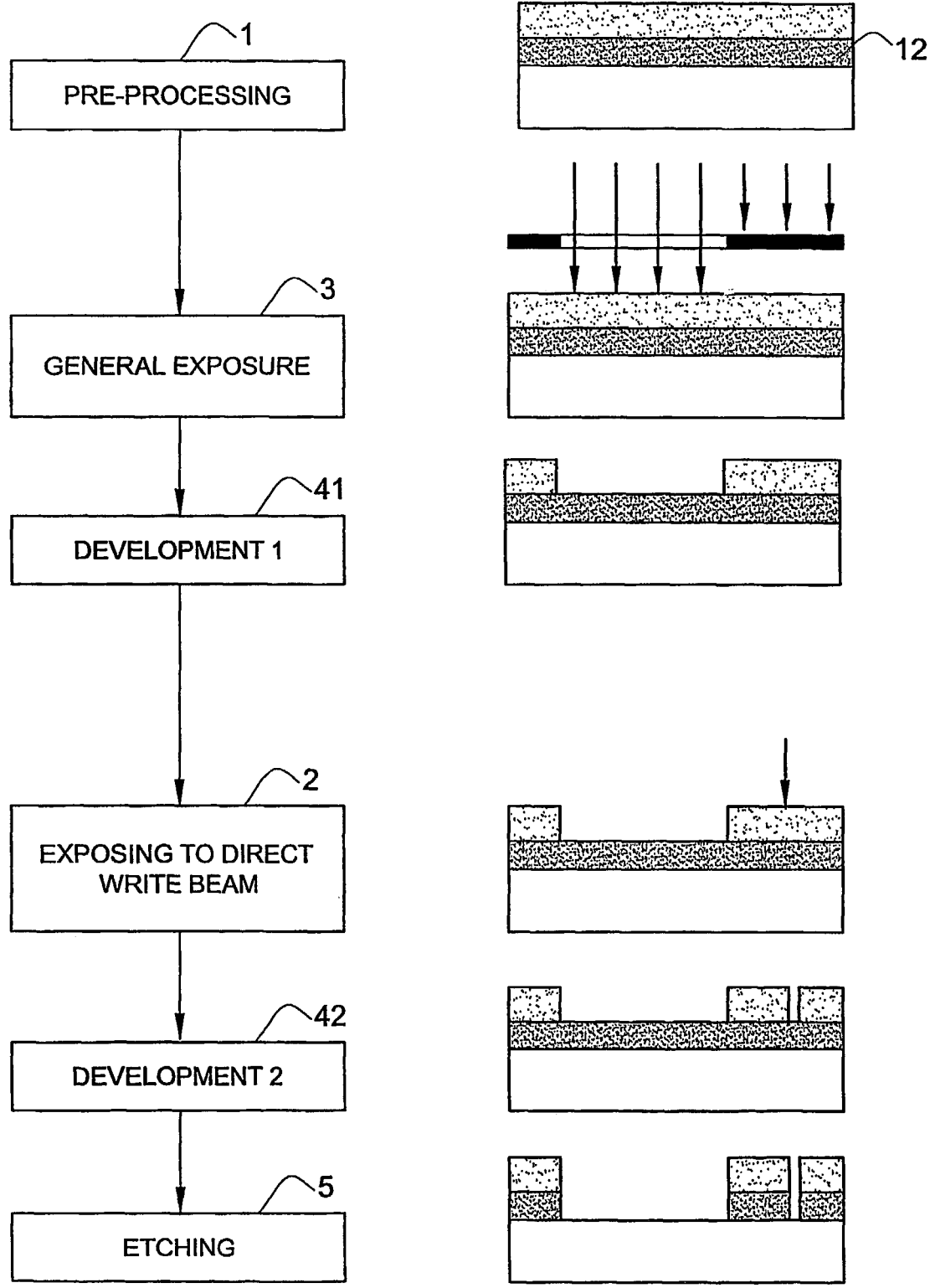

Reference is made now to FIG. 1a through FIG. 1d, which illustrate these sequences of which FIG. 1c is in accordance with the prior art and FIGS. 1a, 1b and 1d are modifications thereof.

A sequence A, shown in FIG. 1a, starts from a conventional pre-processing step 1 of the conventional lithography process applied to a semiconductor wafer. A layer 12 of a material was, for example, deposited on the surface 13 of silicon wafer 11 prior to the lithography process. Layer 12 is coated in this example with a positive photoresist 14 which is optionally pre-baked. Note that depending on whether the layer 12 is a first layer on the wafer 11 or not, the silicon wafer 11 may be (i) a wafer substrate or (ii) the wafer, which already includes not only the first, but also other layers that bear active and passive electronic components or parts thereof.

The sequence A continues with a step 2 of exposing the photoresist to a direct write beam 21 i.e. laser or e-beam, ion beam X-ray beam or other beam source. The beam 21 is used for the specific implementation of the individual circuit, and it is exposed to the photo-resist 14 as defined by the design. Thereafter, a step 3 of using a general photo-mask 31 having a pattern 34 is carried out in order to expose the photo-resist 14 on the whole chip to the general exposure radiation 33. Note that in this and all other sequences described below, the photoresist has appropriate sensitivity both to the general optical parallel exposure, as well as to the direct write exposure.

Further, the exposed regions of the photo-resist 41 and 42 are removed during a development step 4. These regions were exposed to the direct write beam 21 during the step 2, and to the radiation 33 during the step 3, respectively. After the development step 4 and optionally post-bake, the portions of the layer 12 underlying the regions at which photo-resist has been removed are processed conventionally, the process being of any appropriate kind, for example, etch, implant, diffusion, etc., during a step 5, thereby forming electrical circuitry or a part thereof (in this example, etch).

A sequence B, shown in FIG. 1b, provides another possible way of forming the individual electric circuit or parts thereof on the chip layer 12.

The sequence B starts from the conventional pre-processing step 1 that precedes the lithography process described above.

Thereafter, a step 23 is carried out that includes a direct write beam exposure 21 concurrently provided with a general exposure radiation 33 through the pattern 34 of a general photo-mask 31.

Then, the aforementioned conventional development 4 and, for example, etching 5 steps are carried out for removing the photo-resist and the layer portions at the selected areas and thereby forming an electrical circuitry or parts thereof.

A sequence C, shown in FIG. 1c, provides yet another possible way of forming an individual electronic circuit of parts thereof on the chip layer 12. This sequence is known in accordance with the prior art.

The sequence C also starts from the conventional pre-processing step 1 that precedes the lithography process described above.

Then, an opposite order of the sequence A is applied. Hence, firstly, the general exposure step 3 is carried out, and only after the step 3, the step 2 of the direct write beam exposure is provided.

Thereafter, the aforementioned conventional development 4 and etching 5 steps are carried out for removing the photo-resist and the layer portions at the selected areas and, thereby, forming the specified electrical circuitry (designated 53) or parts thereof.

A sequence D, shown in FIG. 1d, provides yet another possible way of forming electrical circuitry on a chip layer 12.

The sequence D also starts from the conventional pre-processing step 1 that precedes the lithography process described above.

Thereafter, the sequence D includes the conventional steps, such as the general exposure 3 and development 41. These conventional steps may be carried out, for example, in conjunction with the lithography stepper.

After the development step 41, but before the conventional etching step, according to the prior art, the direct write beam exposure step 2 is carried out.

Thereafter, a second development 42 for removing the photo-resist at the exposed areas and etching 5 steps are carried out. The layer portions at the exposed areas are removed, thereby forming the specified electrical circuitry of parts thereof.

Turning now to the present invention, it should be noted that while the invention is described with reference to combination of general exposure by means of parallel optical lithography and modification by means of direct write, it likewise applicable when the general exposure is by means of e-beam.

In accordance with a first aspect of the invention the personalization of the chip is accomplished during the lithography process by incorporating in the chip an individualized digital number (e.g. key). The latter is realized by forming in layers of a semiconductor substrate any desired number of Personalized Secure Hardware (PSH) links in accordance with a personalization algorithm. The incorporation of the key in the integrated circuits is preferably accomplished using direct write in the manner described above.

After having removed the photo-resist and having processed the layer portions (e.g. through the etching step described above) the PSH links (e.g. 51) are formed giving rise to the specified digital key.

Whereas the specified description in connection with the prior art referred to etching, the invention in accordance with this aspect is likewise applicable to other processes such as implant, diffusion etc., as can be appreciated by a skilled man in the art.

In accordance with one preferred embodiment, the photo resist is exposed to a direct write beam by means of laser. In accordance with a modified embodiment the e-beam is utilized, by yet another modified embodiment other beam sources are utilized, e.g. an ion beam, and by yet another modified embodiment an X ray beam is utilized. The direct write step is carried out by this embodiment along with parallel optical lithography for the general exposure which is implemented using e.g. a stepper (scanner), scan and repeat system or others, all as known in the art.

In accordance with a preferred embodiment a positive photo resist is utilized. Modification of the process described above for incorporation of digital key using a negative photo resist or reversing a PR by over-exposure from positive to negative or vice versa are evident to a person skilled in the art. Note that in this and all other sequences described below, the photoresist has appropriate sensitivity both to the general optical parallel exposure, as well as to the specific PSH exposure.

According to another aspect of the invention, forming of the PSH links is accomplished by using one or more PSH photo-mask(s) in preferably, a parallel lithographic stepping exposure system which, as recalled, utilizes a general photo-mask that is common for all the chips, for example, in a double exposure mode.

Using PSH photo-mask(s) within the scanner renders the mass production process more efficient as compared to the use of separate direct write system, considering that the necessity to switch between different systems (i.e. the scanner and the direct write system) is obviated. Furthermore, using a PSH photo-mask may be an advantage to the separate direct write approach, since it makes use of the already installed scanner system.

In one preferred embodiment, a dedicated PSH photo-mask is utilized in order to expose into the photo-resist an individualized pattern on every chip. This photo-mask allows only a limited beam to pass through, to bring a laser spot (of appropriate shape and dimension) to the photoresist surface, very much similar to a direct write beam. In this aspect, the specified individualized pattern includes but is not limited to a digital key . As will be appreciated by a person skilled in the art, the additional PSH photo-mask may be applied for each layer either before or after the parallel lithographic stepping exposure. In this case, the links will be selectively exposed according to the individualized pattern required for personalization of the specific chip under the control of the personalization algorithm. The beam and wafer will move under x-y control relatively to each other, and the beam will be pulsed and/or blanked to expose selectively the PSH link locations, as selected by the personalization algorithm for the individual pattern on a specific IC. (See further below.)

In another embodiment of this aspect of the invention, the PSH photo-mask is combined with the general photomask (e.g. for a given layer) such that outside the normal exposure field, there may be a shape to allow for the spot beam exposure in a second double-exposure. The reticle is off-set to direct the beam through this shape instead of the general field, while letting through only the spot beam. This cancels the need to exchange reticles, and thus saves time in production.

The following description of this aspect of the invention, is described with reference to dedicated PSH photo mask (reticle). Those versed in the art will readily appreciate that the description with reference to FIGS. 2A-B and 2E-F is likewise applicable to the case where a PSH photo mask is combined with general photomask, i.e. where a special PSH shape(s) for the spot exposure resides on the general mask itself outside the general field.

Figure 2A:
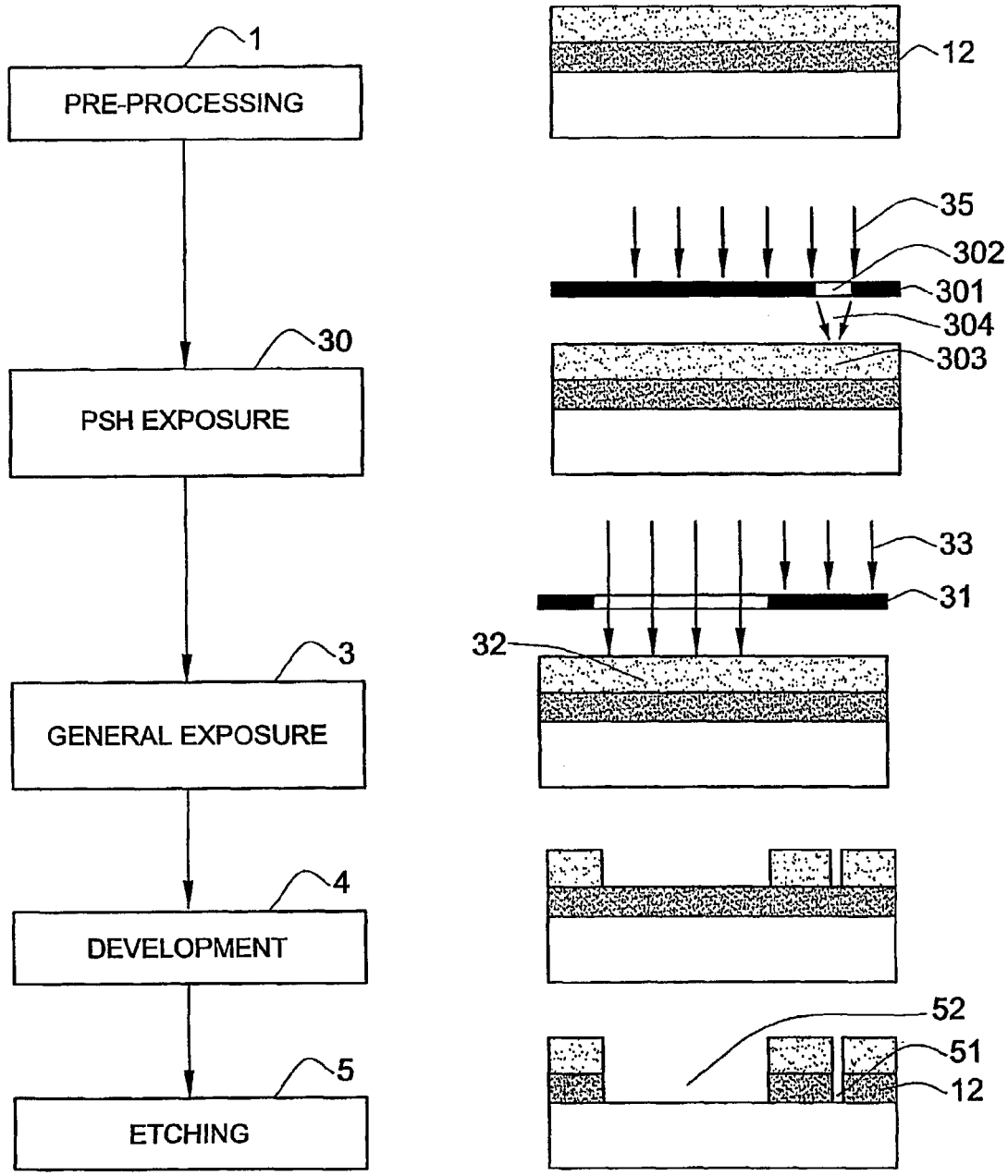
FIG. 2a-2b are simplified flowcharts of various preferred sequences of the manufacturing process steps including the step of forming PSH links by utilizing an additional photomask in accordance with an embodiment of the second aspect of the invention.
Figure 2B:
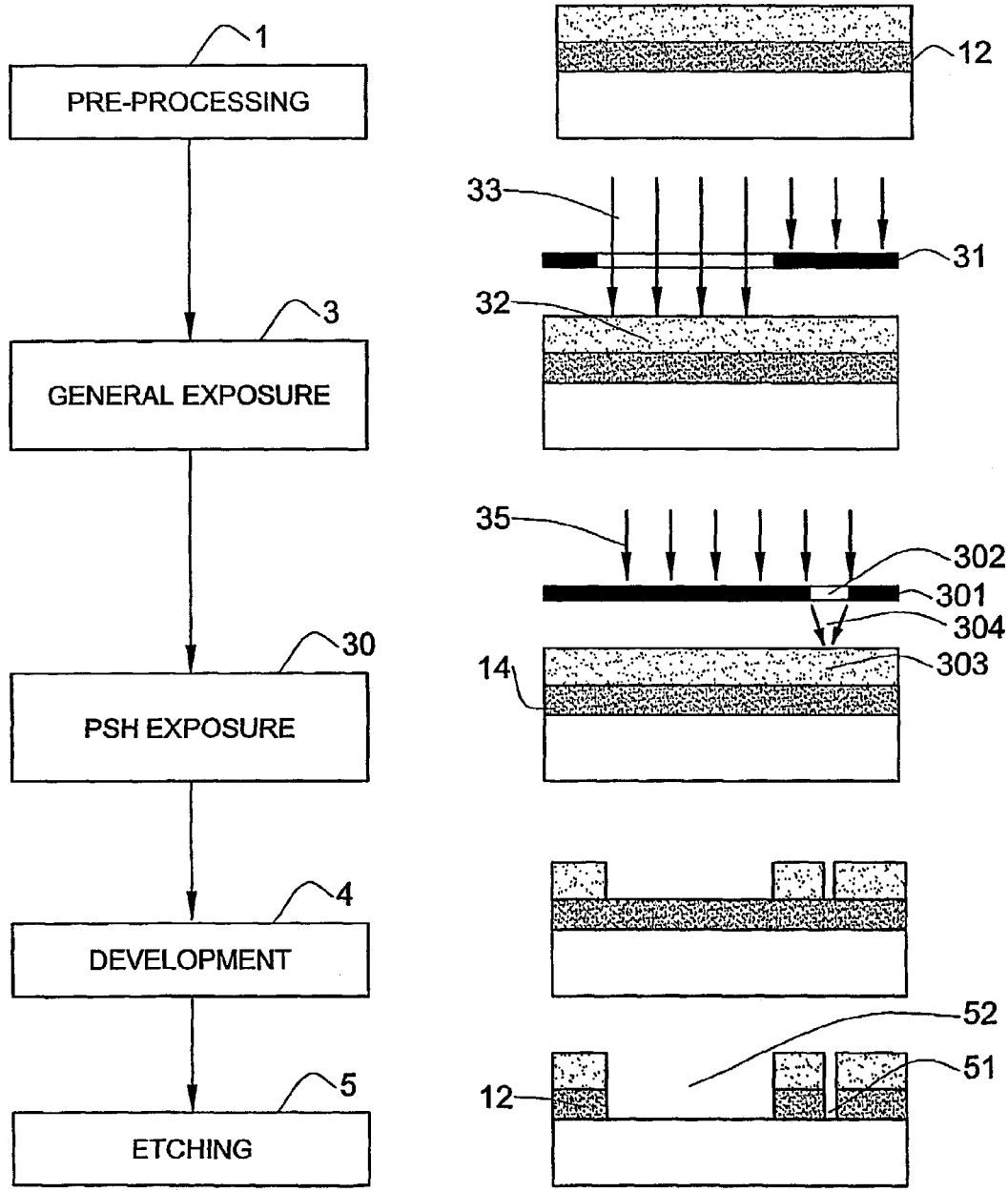

Reference is made now to FIG. 2a and FIG. 2b, which illustrate the sequences of forming the PSH links by using a dedicated PSH photo-mask 301 (or through the PSH shape outside the general field on the general photo-mask), in accordance with one embodiment of the second aspect of the invention.

For a better understanding of the foregoing, attention is now directed to FIG. 2a illustrating a way of forming the PSH links 51 on a layer 12 by using the dedicated PSH photo-mask 301 (or through the PSH shape outside the general field on the general photo-mask) in accordance with a preferred embodiment of the invention. Thus, the sequence starts from the conventional pre-processing step 1 of the lithography process, as described above when the PSH links were formed by means of the direct write beam.

Thereafter, according to this preferred embodiment, a step 30 of exposing the pre-defined locations 303 of the photo-resist 14 to radiation 35 through the PSH photo-mask 301 (or through the PSH shape outside the general field on the general photo-mask, not shown) is carried out. The PSH shape 302 will let through just a spot beam 304 of appropriate shape and form to expose the photoresist at the locations 303, with appropriate energy from the radiation 35.

Figure 2C:
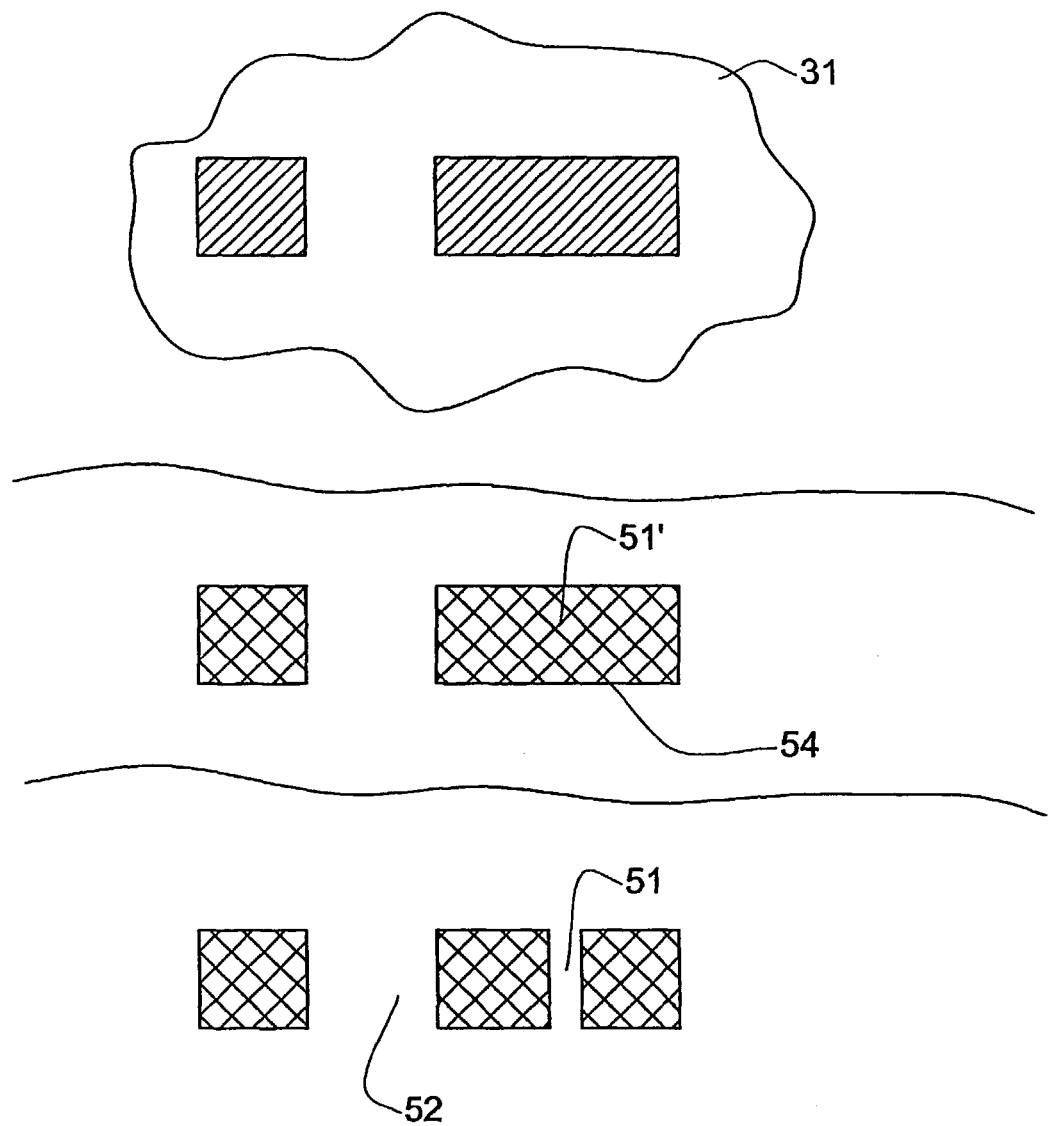
FIG. 2c is a plan view of a photo mask and a resultant positive photo resist that correspond to manufacturing process sequences of FIGS. 1a-1d and 2a-2b.

The step 30 is followed by step 3 of exposing the rest of the chip according to the layout in locations 32 to the general exposure radiation 33 with the general photo-mask 31 (viewed also in plan view in FIG. 2C).

Then, the aforementioned conventional development and optional post-bake 4 and etching 5 steps are carried out for removing the photo-resist and processing the layer portions at the selected areas and thereby forming the PSH links 51 and general design 52 of the desired electrical circuitry of parts thereof. The PSH links 51 and the general design 52 are also shown in the plan view of FIG. 2C. It should be noted, for clarity of explanation, that if during the step 30 the specific predefined location 303 of an individual chip was not selected by the personalization algorithm preferably residing in the scanner station controller, the beam will be blanked, preferably under control of the scanner station controller, and accordingly the corresponding location 51' will not be exposed (as shown in photo resist 54).

Those versed in the art will readily appreciate that the invention according to this aspect is not bound by the etching process and other variants are applicable, e.g. applying implanting or diffusion, etc. A sequence, shown in FIG. 2b, provides another non limiting way of forming the PSH links 51 on the chip layer 12 by using the specific PSH photo-mask 301. The sequence starts from the conventional pre-processing step 1 of the lithography process, as described above when the PSH links were formed by means of the direct write beam.

Further, the step 3 of exposing the locations 32 to a general exposure radiation 33 with the general photo-mask 31 is carried out.

Thereafter, according to this preferred embodiment in accordance with the second aspect of the invention, the step 30 of exposing the pre-defined locations 303 of the photo-resist 14 to the radiation 35 through the PSH photo-mask 301 is carried out. (In an alternative embodiment of this second aspect, this additional exposure may be through the special PSH shape, off-set on the general mask, as described above). The PSH shape 302 will let through just a spot beam 304 of appropriate shape and form to expose the photoresist at the locations 303, with appropriate energy from the radiation 35.

Then, the aforementioned conventional development 4 and etching 5 steps are carried out for removing the photo-resist and processing the layer portions at the selected areas and, thereby, forming the PSH links 51 and general design 52 of the desired electrical circuitry or parts thereof. As specified above, the etching step is only one out of many possible variants.

After the etching step, for each sequence considered above, the remaining photo-resist is removed and the wafers continue processing where the remaining steps of the whole manufacturing process are carried out resulting in completely processed wafers. During the fabrication, the PSH links of each layer are, optionally, covered with subsequent layers that preferably prevent or hinder reverse-engineering by non-intrusive visual analysis, non-destructive micro probing and/or SEM, FIB, e-beam and voltage contrast analysis of the PSH links.

Additionally, for further complication of reverse-engineering analysis, a planarization technology known in the art, such as, for example, chemical mechanical polishing (CMP), may be applied to the wafer. It will be appreciated that the sequences A through D shown in FIG. 1a through FIG. 1d as well as the sequences shown in FIG. 2a and FIG. 2b may be applied to forming PSH links on one or more layers for a chip having any number of layers. The layers may be of any appropriate nature, such as metal and poly-layers, contacts, vias, implants, active/passive regions, etc., provided that they are defined by lithography.

Figure 2D:
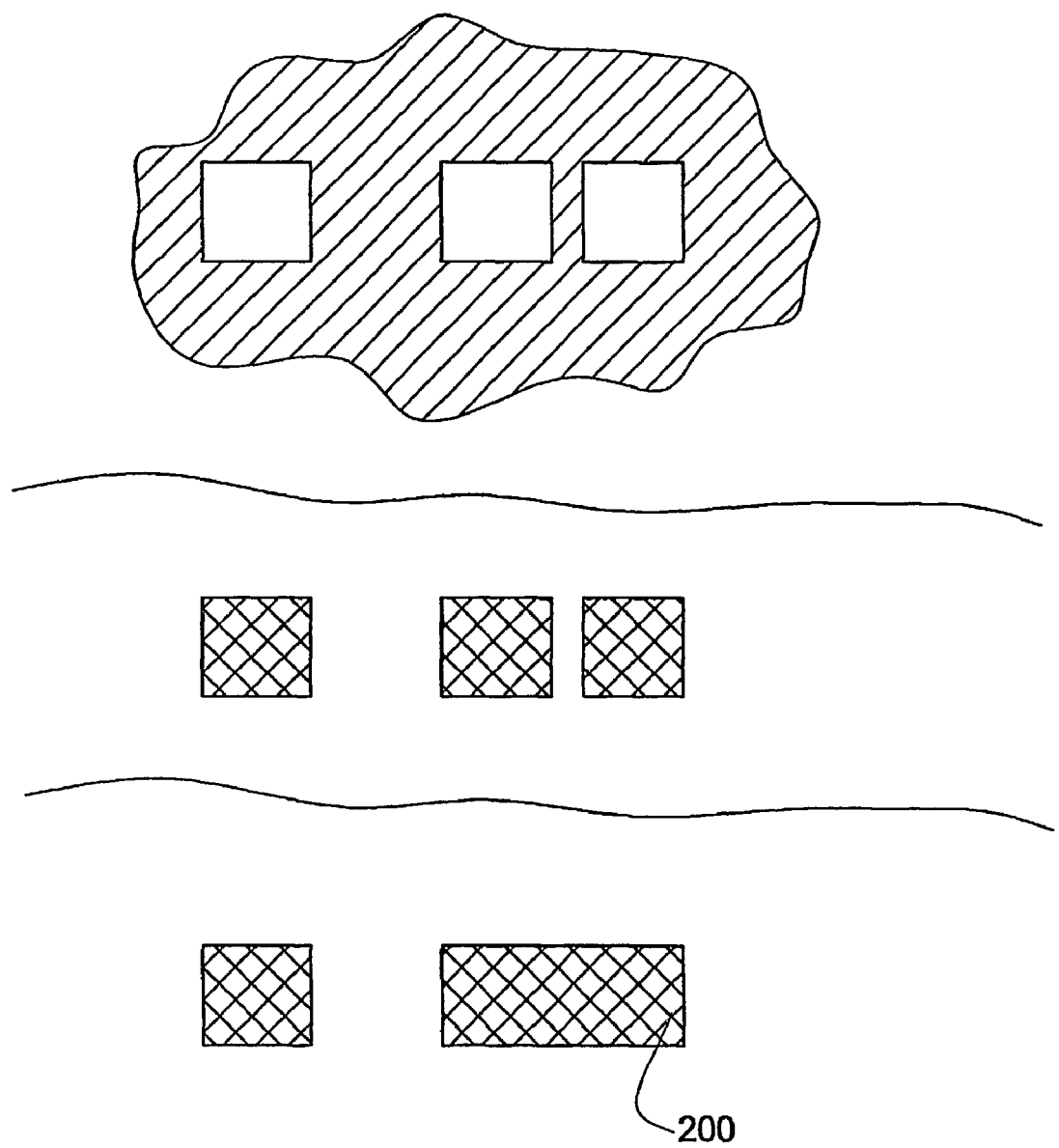
FIG. 2d is a plan view of a photo mask and a resultant negative photo resist that correspond to the manufacturing process sequences of FIGS. 1a-1d and 2a-2b.

Those having skill in the art may appreciate that, in general, there are no special restrictions imposed by the present invention on the conventional steps of lithography process while utilizing the PSH technique of the present invention. In particular, the photo-resist may be not only positive (as it was considered above), but also negative (see FIG. 2d) depending on whether it is removed or remains after the development of the irradiated regions on each layer. The photoresist should have appropriate energy properties to match both the general optical parallel exposure as well as the PSH exposure.

The beam for forming the PSH links can be a laser, electron, X-ray or ion beams or their appropriate combination.

Figure 2E:
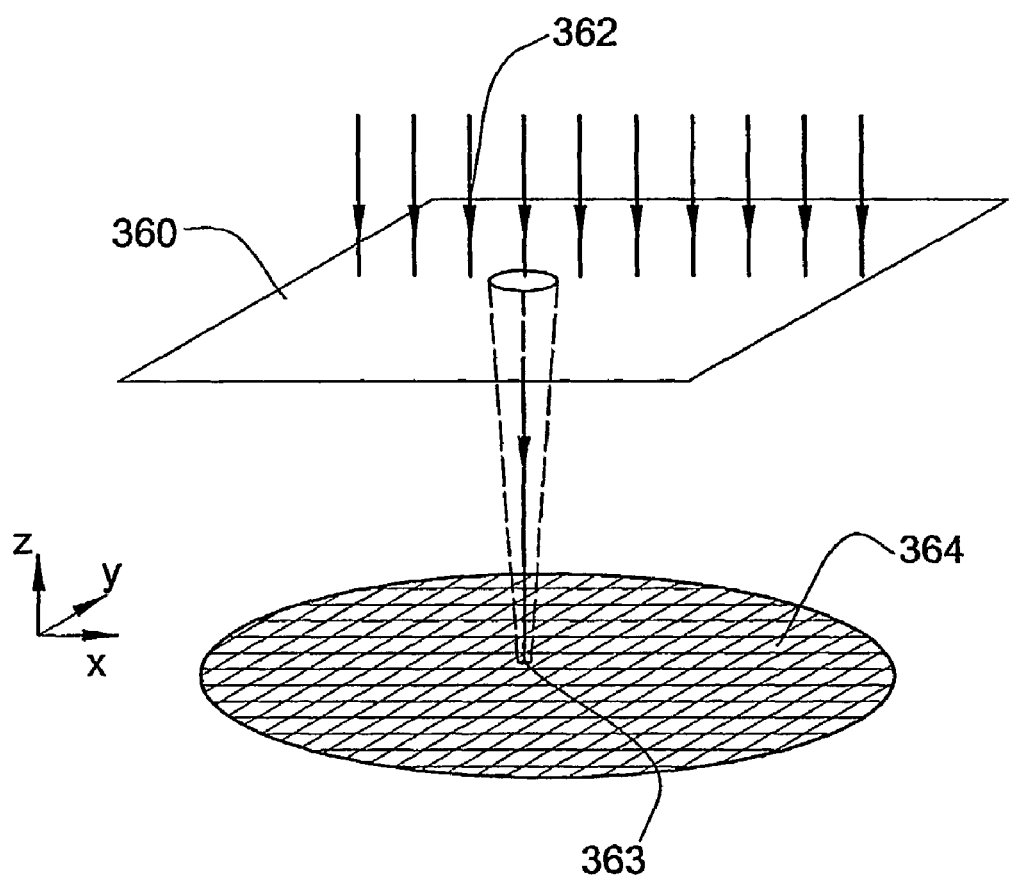
FIG. 2e is a schematic illustration of the exposure through an additional PSH photo mask in accordance with a preferred embodiment of the second aspect of the invention.
Figure 2F:
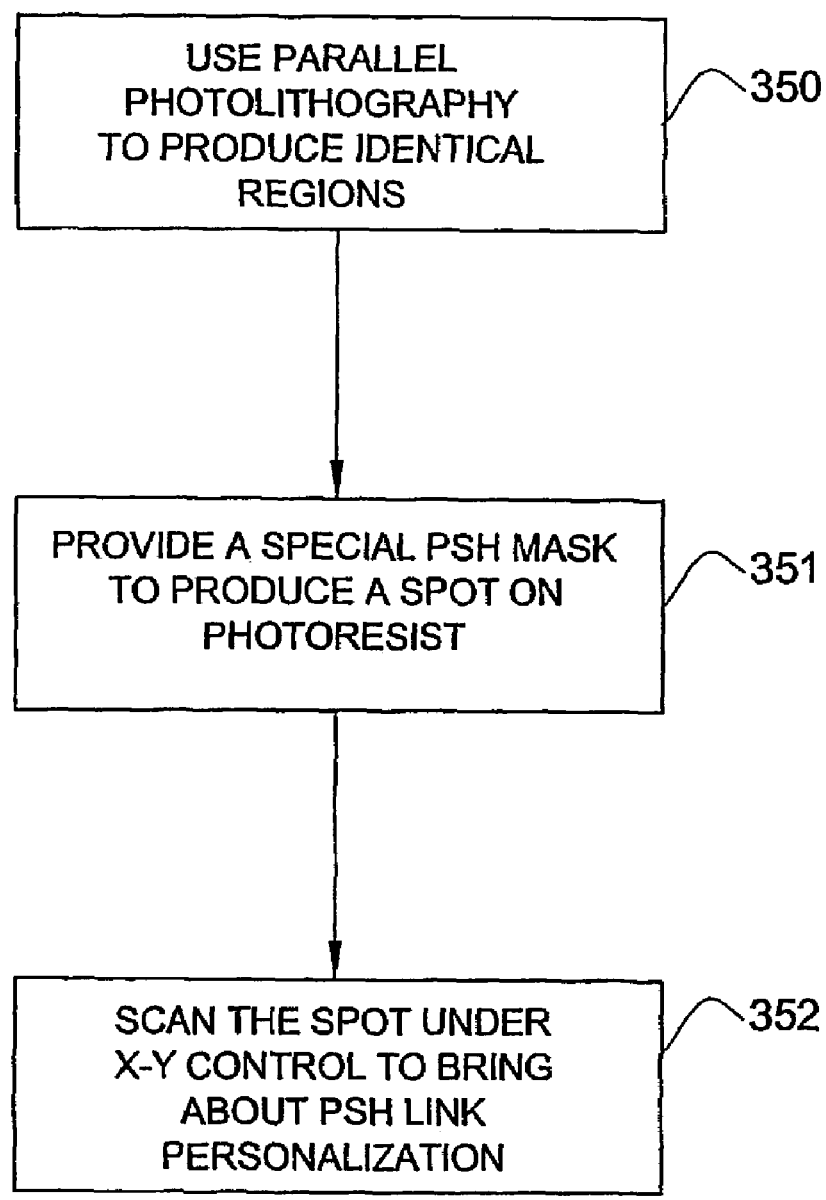
FIG. 2f is a simplified flow chart exemplifying the utilization of a PSH photo mask.

Utilizing the additional PSH photo-mask (or the off-set PSH shape on the general mask) in accordance with the second aspect of the invention will further be exemplified with reference to FIGS. 2e and 2f. Thus, as shown in FIG. 2f, in addition to the parallel exposure 350 through a regular photo-mask, an additional mask is provided 351 (or alternatively the general mask is off-set for the beam to pass through to the PSH shape outside the general field) to produce a spot beam on the photo resist. A schematic illustration of the mask 360 the impinging source 362 and the resultant spot 363 on wafer 364 are depicted in FIG. 2e.

Thereafter, in accordance with step 352 (see FIG. 2f) the spot is scanned under X-Y control and pulsed and/or blanked in a manner known in the prior art so as to give rise to the specific exposure of the pre-defined and selected PSH links in every individual chip.

Figure 3:
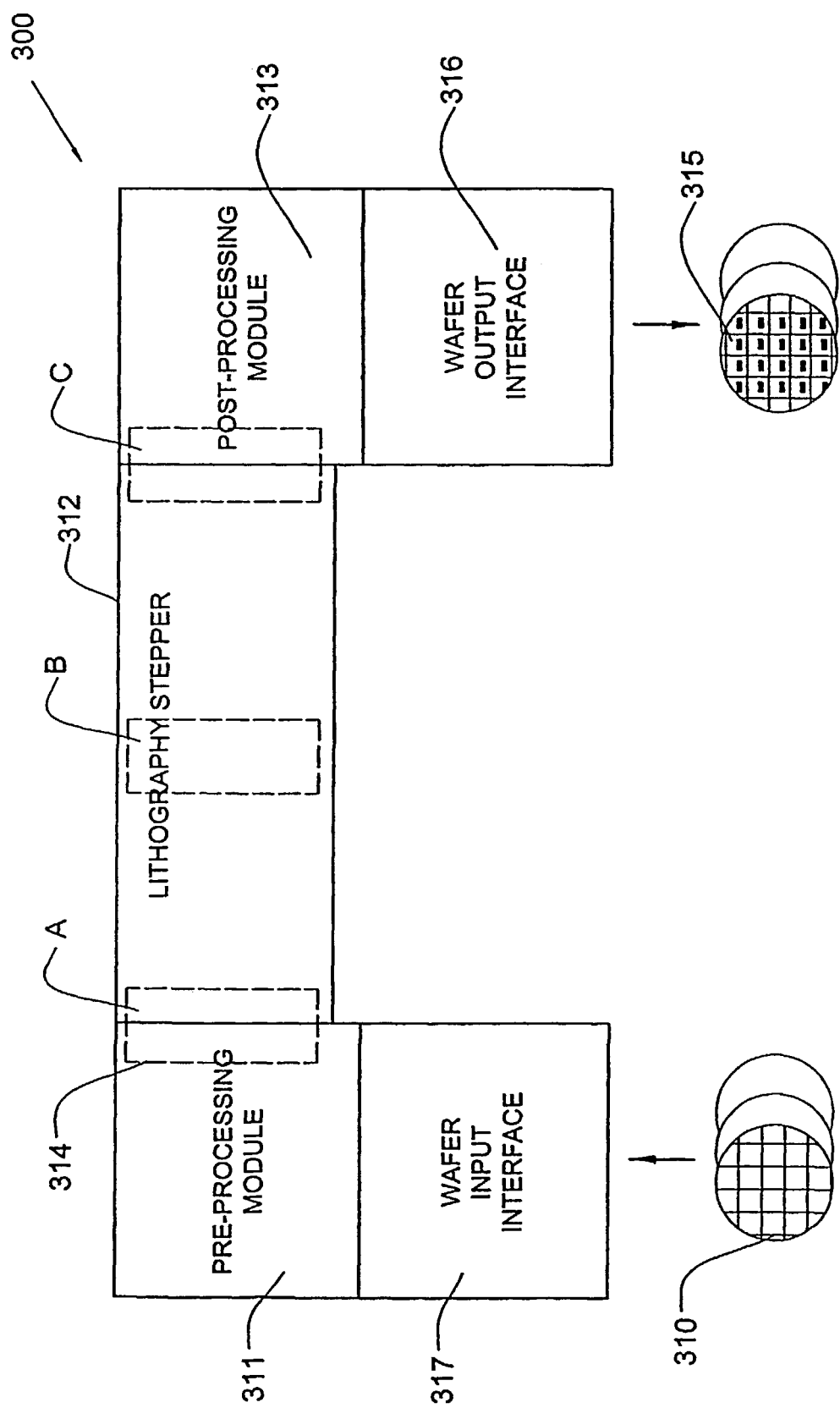
FIG. 3 is a schematic view of a system for personalization of a chip according to a preferred embodiment of the invention.

Reference is made now to FIG. 3, which illustrates schematically an exemplary lithographic system for forming the PSH links in accordance with one embodiment of the present invention. According to a preferred embodiment of the present invention, the system includes a conventional lithography station 300 having a pre-processing module 311 for conducting a conventional pre-processing step 1 of wafers 310, for example PR coat and pre-bake, a lithography stepper 312 for parallel optical exposure, and post-processing module 313 for post-processing the wafers 310, for example by PR develop and post-bake. The pre-processing module 311 and the post-processing module 313 are equipped respectively with a wafer-input interface 317 and a wafer-output interface 316 provided for loading and unloading the wafers 310. It should be noted that FIG. 3 is presented for illustrative purposes only, and the individual and relative dimensions of the system and parts are not in scale in this figure. Furthermore, relative locations of the parts may vary, as set up in production.

According to one preferred embodiment, the lithography station 300 is preferably coupled to a direct write beam station 314 that may be mounted in the lithography station in several places:

A. For providing the sequence A, the direct write beam station 314 is mounted between the pre-processing module 311 and the lithography stepper 312 (location A in FIG. 3).
B. For providing the sequence B, the direct write beam station 314 is mounted in the stepper (location B in FIG. 3), and is operative to work concurrently with general exposure radiation of the stepper 312. (The direct write beam and the general radiation may expose concurrently the same field or different fields.)
C. For providing the sequence C, the direct write beam station 314 is mounted between the lithography stepper 312 and the post-processing module 313 (location C in FIG. 3).
D. In order to provide the sequence D, the direct write beam station is a standalone laser, e-beam or other radiation source station (not shown) or located between the post-processing module 313 and the wafer output interface 316 (not shown)

In another embodiment, for providing sequences A, C or D, the direct write beam station is mounted within the stepper, as in II. In these cases, rather than working concurrently with the general parallel exposure as in sequence B, the direct write will be switched with the parallel exposure, to expose the wafer to either one at a time, as required. The invention may utilize known prior art floorplans and systems for wafer transfer.

By one embodiment, the beam station includes a controller coupled to a computer, a wafer stage, on which the wafers 310 are placed, motorized x-y axis parts for scanning, means for deflection of the beam, optic elements, and a beam blanker (none of these shown). These parts may move with appropriate accuracy in x-, y- or combined x-y directions individually and relatively to each other for selectively exposing each chip on the wafer to the beam at, say, locations 315, in which the specific PSH link(s) should be formed.

For example, the PSH links may be outlined such that the movements are carried out only in one direction to provide a continues scan and applying the "strobe-on-the-fly" beam in the appropriate locations 315. The laffer mode of operation will be discussed in more detail with reference to FIG. 4 below.

Characteristics of the beam, such as wavelength, energy, spot shape, pulse duration and frequency, whether the beam is continuous blanked or pulsed, etc., should preferably be optimized in order to provide required performance in terms of resolution, accuracy, uniformity, stability, etc. in order to differentiate between exposed and non-exposed locations. The locations 315 of the PSH links, the parameters of the movements of the moving parts, as well as the characteristics of the beam may preferably be determined depending upon the particular application. To cope with accuracy, critical dimensions, alignment and throughput time problems, the PSH links can be designed in non critical dimensions, and not necessarily the minimal dimensions (critical dimensions, CDs) for a given technology node. Since the PSH links are relatively a very minor part of the layout and of the chip, the additional area in this case is not significant.

By way of a non-limiting example, a system such as Leica ZBA32, commercially available from Leica Microsystems Lithography GmbH, can be used as a direct write e-beam system.

Figure 4:
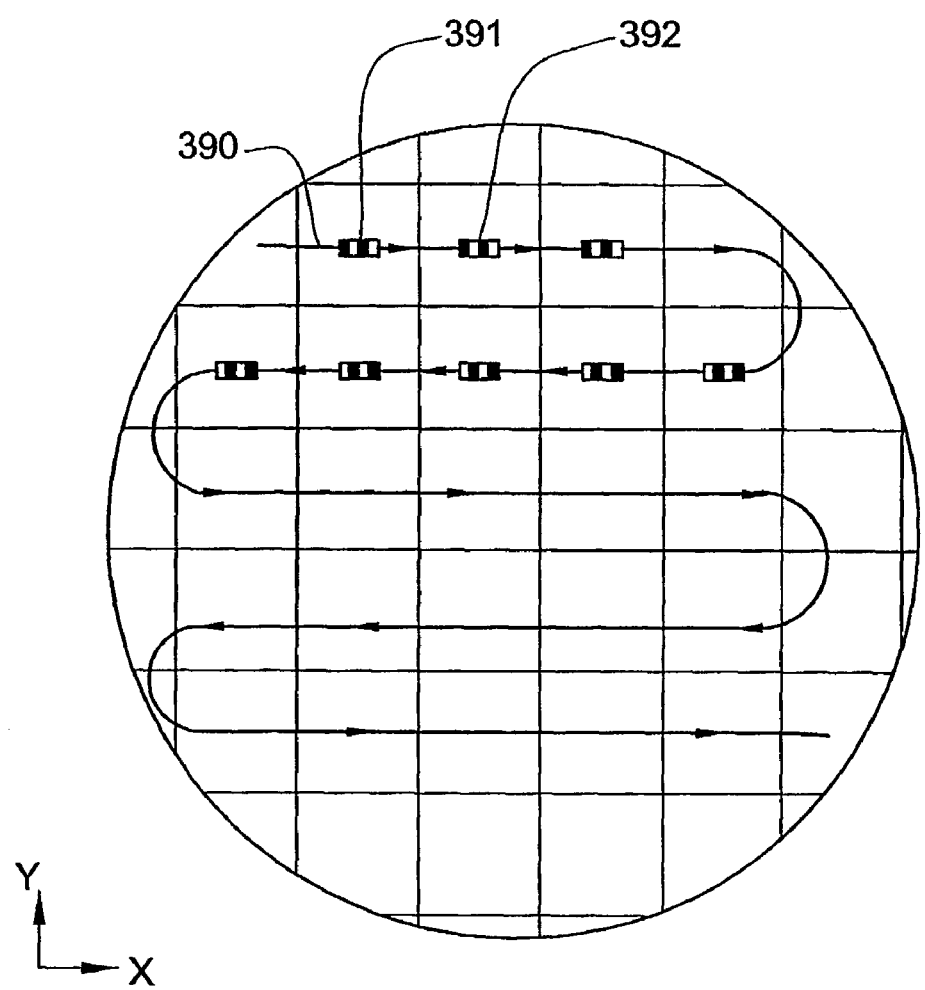
FIG. 4 illustrates schematically a wafer with chips that are scanned in a strobe on-the-fly mode of operation in accordance with an aspect of the invention.

Turning now to FIG. 4, there is shown a schematic illustration of a wafer with chips that are scanned in a strobe-on-the-fly mode of operation in accordance with another aspect of the invention. This mode of operation is particularly applicable in the case that the movement of the scanning beam relatively to the wafer is only within the range of deflection and in the X or Y direction for each row of chips on the wafer. During the scanning, the beam is pulsed and/or blanked. A typical yet not exclusive example of such scanning mode is illustrated in FIG. 4, where the beam scans along a path 390 in the X direction the first row of chips, and after having scanned the first row the beam moves in the Y direction to the second row which is scanned in the opposite direction and so forth. Such a scanning mode is very efficient and particularly useful for mass production series. In accordance with this mode of operation, selected areas in the chip, (e.g. 391 in the first chip and 392 in the second chip) include PSH links at pre-defined locations that are subjected to the individualized exposure to give rise to a digital number or any other electrically functioning circuitry in the manner specified above, obviously under the control of the personalization algorithm. All the locations are aligned along the path 390 and within the range of beam deflection perpendicular to the direction of the beam scan (in a preferred mode, there is no need for deflection at all).

It will be appreciated by persons skilled in the art that the very high flexibility of the PSH technology in accordance with the various aspects of the present invention facilitates a multitude of applications for incorporating in the chip the PSH links so as to give rise to individualized electrical function (digital or analog, as the case may be).

Various examples of such a digital key (that applies to the first aspect of the invention) or any electrically functioning circuitry (that applies also to other aspects of the invention) which utilizes PSH technology of the invention are illustrated below with reference to FIGS. 5 to 10.

EXAMPLE 1

Figure 5:
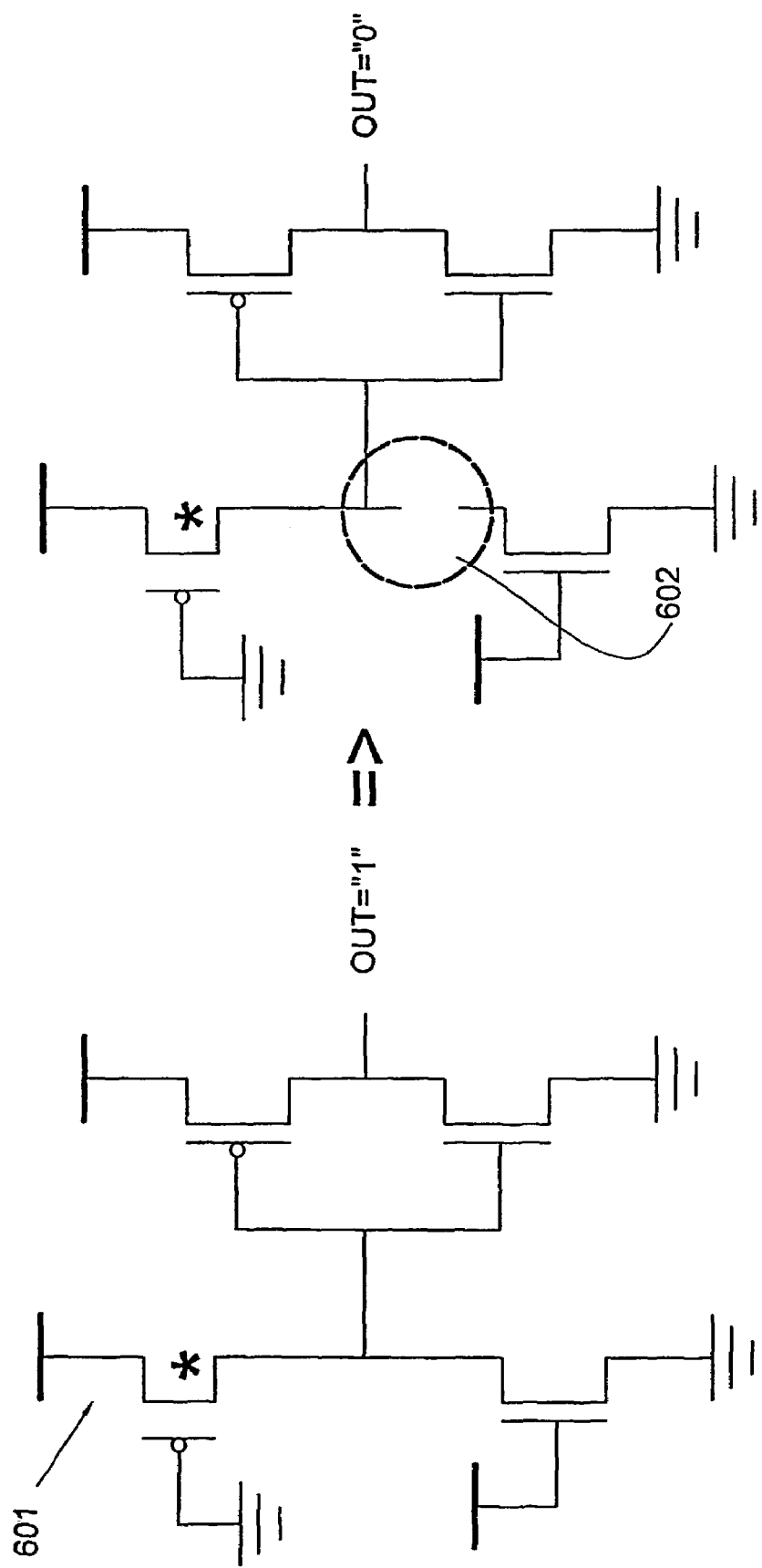
FIG. 5 is an example of implementation the PSH technique of the present invention showing a transform of the inverter gate from "1" into "0"
Figure 6:
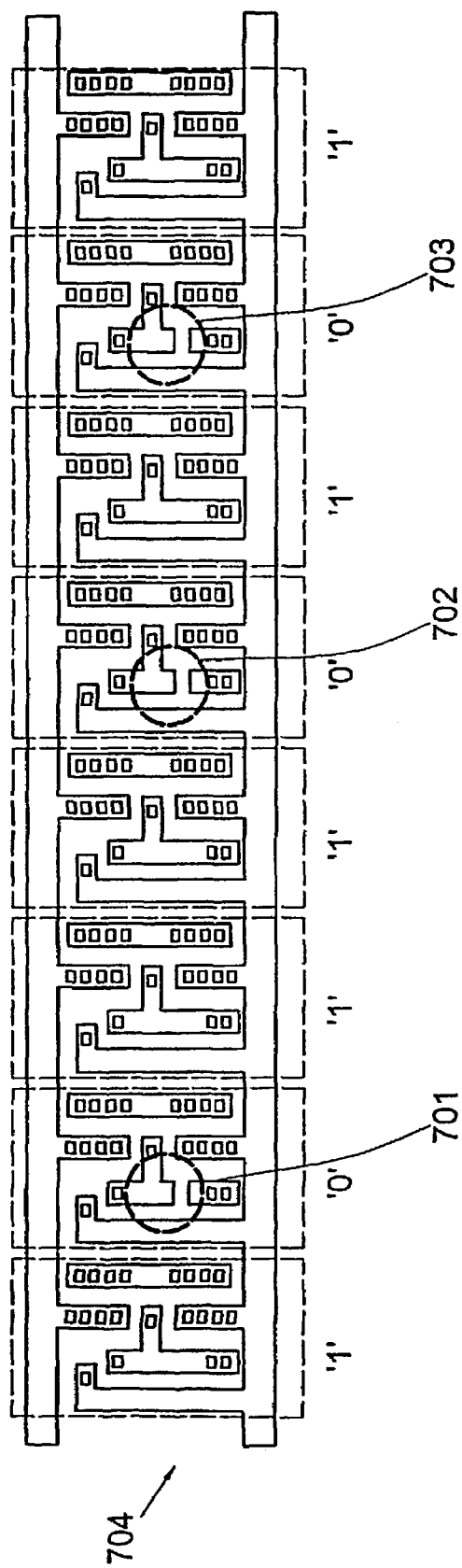
FIG. 6 is an example of implementation the PSH technique of the present invention for 8-bit inverter array.

FIGS. 5-6 show an example of alteration of functioning of electrical circuits by individually expose its elements during the lithography process, in the manner that was described above. A state of an inverter gate circuit 601 (in this example, part of a Pull-Down Register) may be changed from "1" to "0" by exposing the photoresist corresponding to a polygon in the metal layer of a conductor 602 shown in the electrical schematics of the circuit. By following this approach a series of bits that correspond to a digital key can be incorporated into the chip.

Consider, for example, an 8-bit inverter array (functioning as, for example, a digital key) built up from 8 of the gate circuits 601 (the layout of the metal and contact layers as shown in FIG. 6). As will be appreciated by persons skilled in the art, by selectively exposing the photo-resist to a direct write beam or by exposing the photoresist through a special PSH photo-mask, as described above, the corresponding PSH links will be selected, thus enabling or disabling metal etch and, thereby, the disconnection or connection (respectively) required for introducing an individualized digital key code composed of the logic '0' and '1' numbers (respectively). Thus, and as shown in the example in FIG. 8, the disconnected links 701, 702 and 703 correspond to '0' whereas the remaining connected links correspond to '1', giving rise to an 8 bit number (10110101), which may function as a digital key representing the hexadecimal value D5. This individualized 8-bit key array may be incorporated, for example, in area 391 in the chip illustrated in FIG. 4, using, for example, the specified strobe on-the-fly technique. In a similar fashion a different digital key will be incorporated in area 392 of the successive chip in the wafer. As specified above, the digital key may be utilized by any appropriate known prior art application that requires keys, e.g. as a private or public key in the RSA algorithm. The specific key that is incorporated in each chip is determined by the personalization algorithm, selecting what specific PSH links to expose or not.

Thus, in an implementation where a multiplicity of such inverters form an array, the number of individualized combinations is $2^n$, where n is the number of inverters in the array. Insofar as design considerations are concerned, primitive cells that contain such PSH enabled inverters can be a priori stored in a cell library enabling the design, in a simple manner, of $2^n$ different keys using n cells. In the specific simplified example of FIG. 6, 256 different keys may be represented using 8 cells. The PSH links will be selectively exposed to signify '0' (link disconnected) or '1' (link connected), as discussed above. As can be appreciated by a man skilled in the art, in another design each cell may contain more than one PSH link.

By a preferred embodiment (that is not bound by the specific example 1), the movement of the wafer and beam will be such that the beam scans across all the pre-defined PSH locations, and by pulsing the beam and/or blanking the beam, the locations will be exposed to realize the distinct '0' or '1' values that constitute the individualized digital key on a specific chip.

EXAMPLE 2

Figure 7:
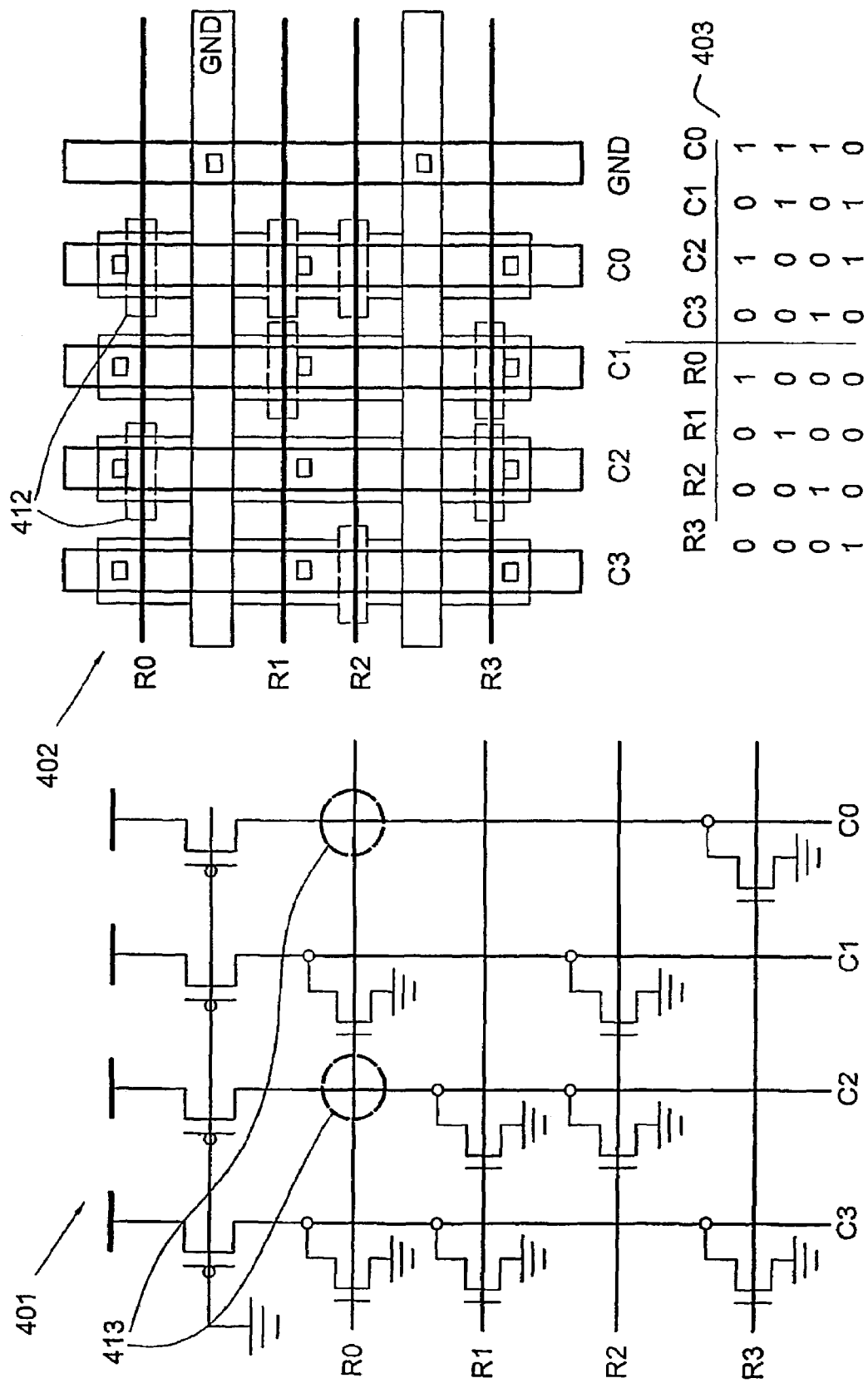
FIG. 7 is an example of implementation the PSH technique of the present invention showing a personalization of a ROM, together with a truth table.

The PSH technique can be used for personalization of a ROM. FIG. 7 shows a schematic 401 and a layout 402 of a Vt implant ROM realizing a Truth Table 403, that is personalized according to the invention. By using the PSH technique, the transistor gate locations 412 on the circuit corresponding to the requested combination of the transistors (e.g. those designated 413) are selectively exposed on the photo resist in order to form PSH links and thereby enabling Vt (threshold voltage) implant during manufacture of the chip. The presence or absence of the Vt implant, as individually defined during the PSH exposure of each chip, will implement respectively the logic '1's and '0's in the ROM truth table, different in every chip.

EXAMPLE 3

Figure 8:
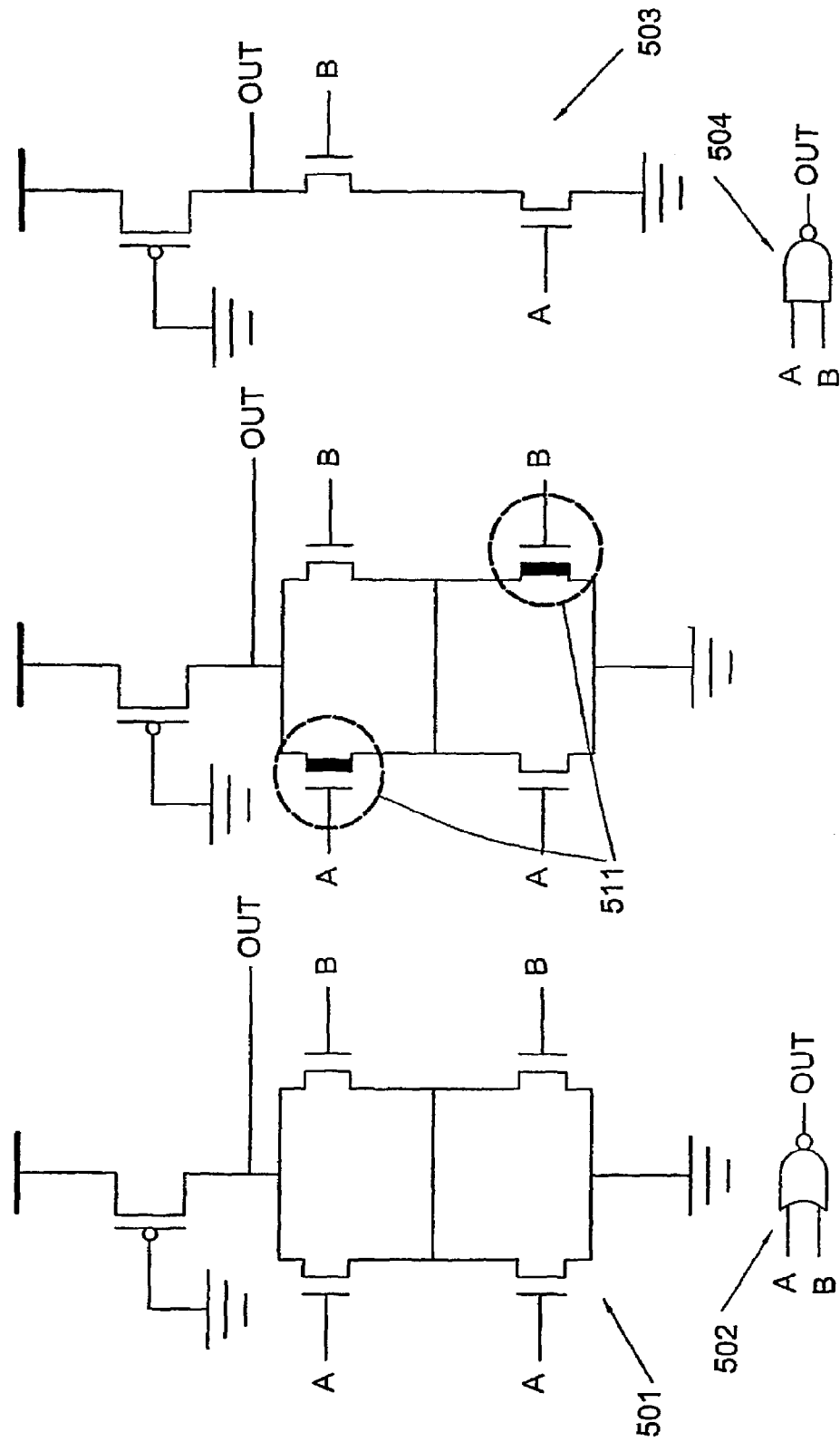
FIG. 8 is an example of implementation the PSH technique of the present invention showing a transform of a NOR gate into a NAND gate.

According to a preferred embodiment, special care can be taken for security applications to layout the PSH links to make them visually identical to circuits that do not contain PSH links. FIG. 8 shows an example of alteration of a characteristic of an electrical circuit 501 corresponding to a logic NOR gate (diagram 502). After the alteration by utilizing the PSH technique the NOR gate circuit 501 effectively transforms into a circuit 503 corresponding to of a logic NAND gate (diagram 504). During the chip manufacture, by selectively forming the PSH links, and thereby enabling or blocking Vt implant, two transistors 511 of the electrical circuit 501 are effectively cancelled. The circuit visually looks like a NOR gate, but effectively behaves like a NAND gate. This may be good for security purposes, making reverse engineering more difficult.

Combining a multitude of such gates, for example, and selectively exposing them will enable implementation of digital keys and numbers, etc., similar to the combination of the inverters in Example 1.

EXAMPLE 4

Figure 9:
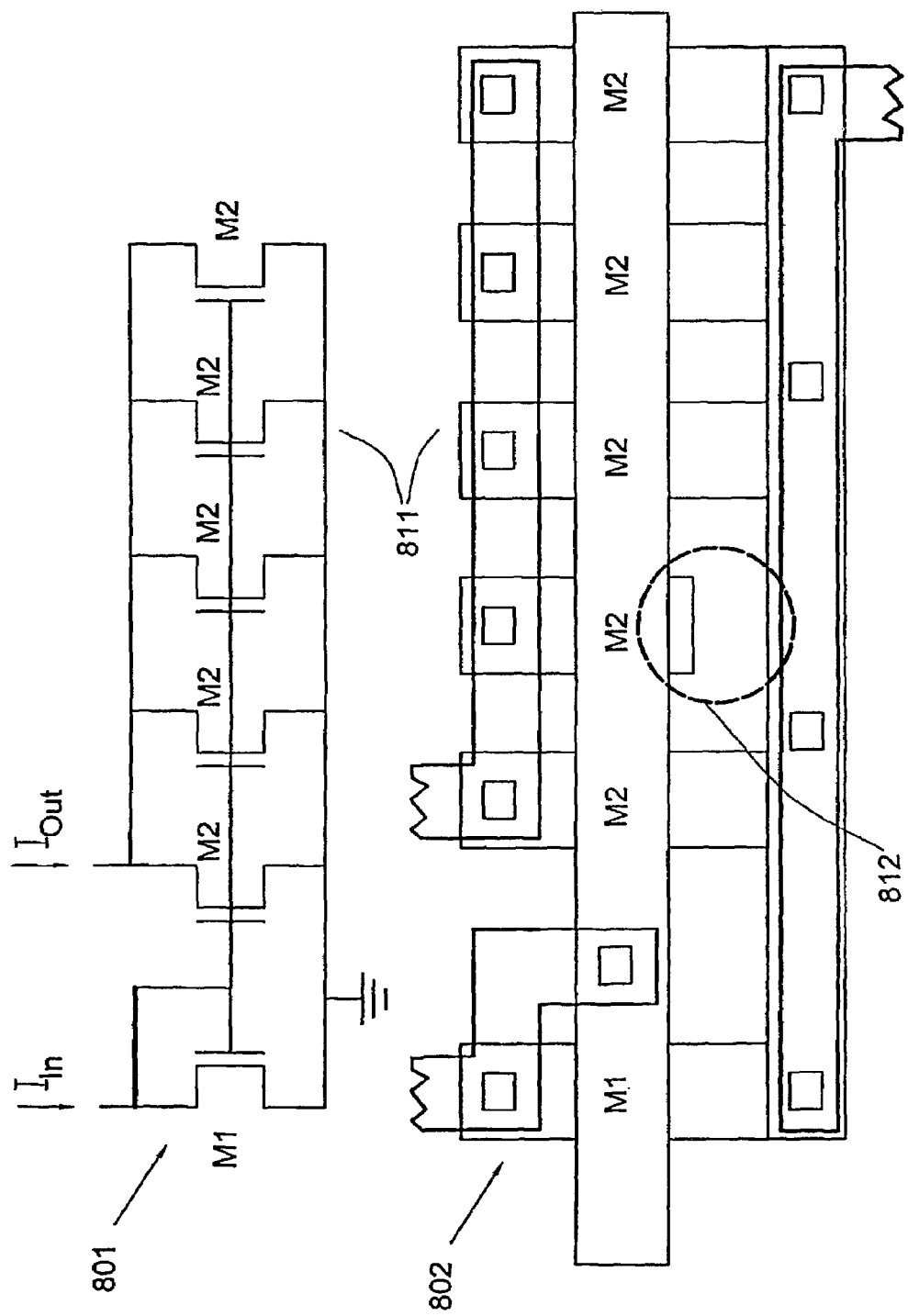
FIG. 9 is an example of implementation the PSH technique of the present invention for a tunable current mirror.

Analog circuits may be personalized for various applications. As an example, FIG. 9 shows an electrical scheme 801 and the corresponding layout 802 of a Tunable Current Mirror circuit. The output current of the circuit may be tuned by selecting an appropriate M2 transistor 811 and exposing the photoresist corresponding to the polygon 812 in the active diffusion region layer by using the PSH technology. A man skilled in the art will appreciate the effects of using positive or negative PR. By selectively exposing the M2 transistors, the current can be individually tuned. Thus, for example, a reference voltage or current can be defined in a comparator. Such a comparator may be utilized, for example, for personalizing analog characteristics of sensors, audio devices, etc.

As will be appreciated by persons skilled in the art, an electrically functioning individualized circuit incorporated by using PSH technology to implement a digital key may be realized as a series of bits of practically any desired size. As specified above, such a key may be utilized for many applications, e.g. as a key for various algorithms including but not limited to algorithms for identification and/or authentication purposes, e-commerce transactions and others.

Insofar as the second and third aspect of the invention are concerned, the technology is not confined only to digital key, but rather it can be utilized in any electronically functioning digital or analog circuit. Other possible applications include redundancy designs, debug and split designs, etc. where the final version(s) will be defined by PSH technology according to intermediate test results, market demand, etc., without the need for additional masks.

Regardless of the aspect under consideration, for enhanced security, the whole circuit may further be covered fully or partly by subsequent layers to prevent non-intrusive or non-destructive access.

The digital key may be computed with a personalization algorithm utilizing one or more specific manufacturing parameters, such as the lot number, the wafer number and the die x-y coordinates that individually define each chip.

The personalization algorithms may be different for each chip layer, to enhance security.

For example, a simple algorithm for chip personalization is using the lot number, wafer number and x-y coordinates themselves. A more complicated algorithm may utilize for personalization a number that is a function of the lot number, wafer number and x-y coordinates. As another example, a random number (or a pseudo-random number) can be used itself or as a seed for chip personalization. This (pseudo-) random number can, for instance, be generated by the controller of the PSH exposure station. The personalization algorithm is kept, if desired, in a secure encrypted format in the PSH exposure station controller, whether it is a separate direct write station or integrated in the scanner, both as described above. This controller may be kept safely, to adhere to required security standards. By this embodiment (for example, with respect to the strobe on-the-fly mode of operation), the chip individualized combination is utilized to strobe the beam to expose the corresponding selected link locations in the specific chip, while scanning in the x-y axis, as described above.

While the present invention has been described with a certain degree of particularity, those having skill in the art to which the present invention pertains can now perceive that various alterations, modifications, improvements and additions may be carried out without departing from the following claims.

The invention claimed is:

1. A method for personalizing an electrical circuit having at least one layer having electrical characteristics, the layer being produced by an electrical characteristic determination process (ECDP), the method for personalizing comprising:
   providing a wafer suitable for producing thereon a plurality of electrical circuits each having at least one layer; and
   during production of the at least one layer:
   using a first ECDP on at least one photoresist layer to produce a pattern in the at least one photoresist layer corresponding to electrical circuitry having identical electrical characteristics on the wafer in each of the plurality of electrical circuits;
   using a second ECDP, including a personalization algorithm, on said at least one photoresist layer to produce a pattern therein which corresponds to a modification of at least one electrical characteristic of at least one of the plurality of electrical circuits; and
   developing said at least one photoresist layer after patterning thereof to produce said plurality of electrical circuits,
   said personalization algorithm being used for generating at least one of a random individualized digital number and a pseudo-random individualized digital number in each of said plurality of electrical circuits by selectively exposing said at least one photoresist layer thereby introducing said digital number.

2. The method according to claim 1 and wherein the first ECDP and the second ECDP each comprise optical lithography.

3. The method according to claim 1 and wherein the first ECDP and the second ECDP each comprise direct beam writing.

4. The method according to claim 1 and wherein the first ECDP comprises parallel optical photolithography, and the second ECDP comprises at least one of direct laser beam writing and direct e-beam writing.

5. The method according to claim 1 and also comprising:
   covering said at least one layer by at least one subsequent layer, said at least one subsequent layer including at least one of a dielectric layer and a metal layer, in order to hide said modification in each of said plurality of electrical circuits, thereby hindering reverse-engineering analysis.

6. The method according to claim 1 and also comprising utilizing planarization to hinder reverse-engineering analysis.

7. The method according to claim 1, wherein said at least one of a random individualized digital number and a pseudo-random individualized digital number is a digital key.

8. The method according to claim 1, wherein said at least one of a random individualized digital number and a pseudo-random individualized digital number serves as an input to an application.

9. The method according to claim 1, wherein each of said plurality of electrical circuits implements at least one of the following: a redundancy design; a debug design; and a chip design.

10. The method according to claim 1 wherein said personalization algorithm is operative to at least one of deflect, blank and pulse a beam to generate at least one of said at least one of a random individualized digital number and a pseudo-random individualized digital number and to generate electrically functioning circuitry.

11. The method according to claim 1 wherein said personalization algorithm utilizes at least one of at least one manufacturing parameter; a random number; a pseudo-random number; a digital number; a chip location on a wafer; a serial number; an ID number; a program; and a list of numbers for generating said at least one of a random individualized digital number and a pseudo-random individualized digital number.

12. The method according to claim 11, wherein said at least one manufacturing parameter is selected from the group consisting of a lot number, a wafer number and an electrical circuit x-y coordinates that uniquely defines each of said plurality of electrical circuits.

13. The method according to claim 1, wherein the modification of at least one electrical characteristic of at least one of the plurality of electrical circuits comprises modifying by exposure through at least one Personalized Secure Hardware (PSH) photo-mask.

14. The method according to claim 13, wherein at least one of said at least one PSH photo-mask is a dedicated PSH mask.

15. The method according to claim 13, wherein at least one of said at least one PSH photo-mask is combined with a general photomask.

16. The method according to claim 1, wherein:
   said first ECDP comprises parallel optical photolithography;
   said second ECDP comprises direct writing; and
   said direct writing includes scanning the wafer in either one of X and Y directions and applying during said scanning strobe on-the-fly so as to accomplish said modification.

17. The method according to claim 16, wherein said direct writing comprises direct laser beam writing.

18. The method according to claim 16, wherein said direct writing comprises direct e-beam writing.

19. The method according to claim 16 wherein the strobe on-the-fly is controlled by said personalization algorithm which is operative to at least one of deflect, blank and pulse a beam to generate at least one of said at least one of a random individualized digital number and a pseudo-random individualized digital number and to generate electrically functioning circuitry.

20. A method according to claim 1 wherein said using a first ECDP comprises using a photo mask for a general lithography exposure, said photo mask including pre-defined PSH link locations for personalization in an additional exposure.

21. The method according to claim 20 and wherein the general lithography comprises optical lithography.

22. The method according to claim 20 and wherein the additional exposure comprises direct write lithography.

23. The method according to claim 20 and wherein the photo mask comprises a positive photo mask.

24. The method according to claim 20 and wherein the photo mask comprises a negative photo mask.

25. A method according to claim 1 wherein said using a first ECDP comprises using a cell adapted to be included in a chip design cell library, said cell comprising at least one PSH link location.

26. The method according to claim 25 and wherein the at least one PSH link location comprises a plurality of PSH link locations.

27. The method according to claim 1, wherein said at least one of a random individualized digital number and a pseudo-random individualized digital number is implemented in a decryption module that utilizes said at least one of a random individualized digital number and a pseudo-random individualized digital number.

28. The method according to claim 27, wherein said decryption module realizes a decryption algorithm.

29. A method for personalizing an electrical circuit having at least one layer having electrical characteristics, the layer being produced by an electrical characteristic determination process (ECDP), the method for personalizing comprising:

providing a wafer suitable for producing thereon a plurality of electrical circuits each having at least one layer; and during production of the at least one layer:

using a first ECDP on at least one photoresist layer to produce a pattern in the at least one photoresist layer corresponding to electrical circuitry having identical electrical characteristics on the wafer in each of the plurality of electrical circuits; and using a second ECDP, including a personalization algorithm, on said at least one photoresist layer to produce a pattern therein which corresponds to a modification of at least one electrical characteristic of at least one of the plurality of electrical circuits, the second ECDP comprises direct writing; and wherein said direct writing includes scanning the wafer in either one of X and Y directions and applying during said scanning strobe on-the-fly so as to accomplish said modification, thereby personalizing the at least one of the plurality of electrical circuits, said personalization algorithm being used for generating at least one of a random individualized digital number and a pseudo-random individualized digital number in each of said plurality of electrical circuits by selectively exposing said at least one photoresist layer thereby introducing said digital number.

30. The method according to claim 29, wherein the strobe on-the-fly is controlled by said personalization algorithm which is operative to at least one of deflect, blank and pulse a beam to generate at least one of said at least one of a random individualized digital number and a pseudo-random individualized digital number and to generate electrically functioning circuitry.

* * * * *

UNITED STATES PATENT AND TRADEMARK OFFICE
CERTIFICATE OF CORRECTION

| | | |
|---|---|---|
| PATENT NO. | : 7,316,934 B2 | Page 1 of 1 |
| APPLICATION NO. | : 10/181518 | |
| DATED | : January 8, 2008 | |
| INVENTOR(S) | : Efraim Mangell | |

It is certified that error appears in the above-identified patent and that said Letters Patent is hereby corrected as shown below:

On the Title page item (30), in Foreign Application Priority Data, cancel the text beginning with "Jan. 20, 2000" and ending in "60/237,458."

Signed and Sealed this

Seventh Day of April, 2009

JOHN DOLL
*Acting Director of the United States Patent and Trademark Office*